United States Patent
Sakui et al.

(10) Patent No.: US 12,367,923 B2
(45) Date of Patent: Jul. 22, 2025

(54) SEMICONDUCTOR ELEMENT MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 164 days.

(21) Appl. No.: 18/238,674

(22) Filed: Aug. 28, 2023

(65) Prior Publication Data
US 2023/0410894 A1 Dec. 21, 2023

Related U.S. Application Data

(63) Continuation-in-part of application No. PCT/JP2021/008756, filed on Mar. 5, 2021.

(51) Int. Cl.
*G11C 11/4096* (2006.01)
*G11C 11/408* (2006.01)
(Continued)

(52) U.S. Cl.
CPC ...... *G11C 11/4096* (2013.01); *G11C 11/4087* (2013.01); *G11C 11/4097* (2013.01); *H10B 12/20* (2023.02)

(58) Field of Classification Search
CPC .......... G11C 11/4097; G11C 11/4087
See application file for complete search history.

(56) References Cited

U.S. PATENT DOCUMENTS 7,105,390 B2 * 9/2006 Brask ................. H10D 64/017
                                                                 438/149
2006/0049444 A1    3/2006 Shino
(Continued)

FOREIGN PATENT DOCUMENTS

JP   H02188966 A   7/1990
JP   H03171768 A   7/1991
(Continued)

OTHER PUBLICATIONS

Written Opinion of the International Searching Authority in International Application No. PCT/JP2021/008756 dated May 18, 2021 (4 pages).
(Continued)

*Primary Examiner* — Anthan Tran
(74) *Attorney, Agent, or Firm* — Crowell & Moring LLP

(57) ABSTRACT

A memory device includes pages each constituted by a plurality of memory cells arranged in columns on a substrate, voltages applied to a first gate conductor layer, a second gate conductor layer, a first impurity region, and a second impurity region in each memory cell included in each page are controlled to perform a page write operation of retaining a group of positive holes, generated by an impact ionization phenomenon or a gate-induced drain leakage current, inside a semiconductor body, the voltages applied to the first gate conductor layer, the second gate conductor layer, the first impurity region, and the second impurity region are controlled to perform a page erase operation of discharging the group of positive holes from inside the semiconductor body and further lowering a voltage of the semiconductor body with capacitive coupling with the first gate conductor layer and with the second gate conductor layer, and in the page erase operation, at least two (Continued)

or more pages are simultaneously selected from among the pages and the page erase operation is performed.

13 Claims, 15 Drawing Sheets

(51) Int. Cl.
*G11C 11/4097* (2006.01)
*H10B 12/00* (2023.01)

(56) References Cited

U.S. PATENT DOCUMENTS

2008/0212366 A1  9/2008  Ohsawa
2019/0096917 A1* 3/2019  Morrow .............. H10D 84/811

FOREIGN PATENT DOCUMENTS

JP  2006-80280 A   3/2006
JP  H3957774       5/2007
JP  2008-218556    9/2008

OTHER PUBLICATIONS

Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).
Chung, H., et al., "Novel 4F² DRAM Cell with Vertical Pillar Transistor(VPT)" *2011 Proceedings of the European Solid-State Device Research Conference* (2011) (4 pages).
Wong, H.S., P., et al., "Phase Change Memory" *Proceedings of the IEEE*, vol. 98, No. 12, Dec. 2010, pp. 2201-2227 (27 pages).
Tsunoda, K., et al., "Low Power and High Speed Switching of Ti-doped NiO ReRAM under the Unipolar Voltage Source of less than 3 V" IEDM (2007) pp. 767-770, (4 pages).
Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).
Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).
Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).
Ohsawa, T., et al., "Memory Design Using a One-Transistor Gain Cell on SOI", *IEEE Journal of Solid-State Circuits*, vol. 37, No. 11, Nov. 2022, pp. 1510-1522 (13 pages).
Shino, T., et al., "Floating Body RAM Technology and its Scalability to 32nm Node and Beyond", IEEE IEDM (2006) (4 pages).
Yoshida, E., et al., "A Design of a Capacitorless 1T-DRAM Cell Using Gate-induced Drain Leakage (GIDL) Current for Low-power and High-speed Embedded Memory" IEEE IEDM, pp. 913-916, Dec. 2003 (4 pages).
Song, J., et al., "Design Optimization of Gate-All-Around (GAA) MOSFETs" *IEEE Transactions on Nanotechnology*, vol. 5, No. 3, pp. 186-191, May 2006 (7 pages).
Loubet, N., et al., "Stacked Nanosheet Gate-All-Around Transistor to Enable Scaling Beyond FinFET" *2017 Symposium on VLSI Technology Digest of Technical Pagers*, T230-T231, Jun. 2017 (2 pages).
Jiang, H., et al., "Experimental Investigation of Self-Heating Effect (SHE) in Multiple-Fin SOI FinFETS" *Semicond. Sci. Technol.* 29 (2014) 115021 (9 pages).
Yoshida, E., et al., "A Capacitorless 1T-DRAM Technology Using Gate-Induced Drain-Leakage (GIDL) Current for Low-Power and High-Speed Embedded Memory" *IEEE Transactions on Electron Devices*, vol. 53, No. 4, Apr. 2006 (6 pages).

* cited by examiner

FIG. 2A

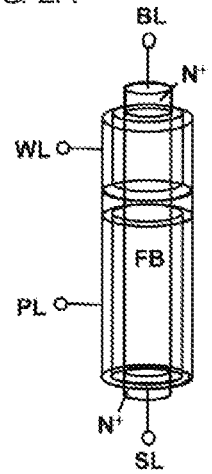

FIG. 2B

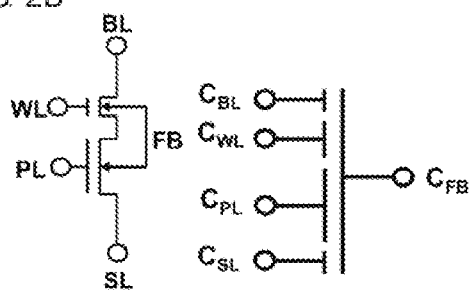

$$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \Rightarrow \text{SMALL } \beta_{WL}$$

$$\beta_{PL} = \frac{C_{PL}}{C_{WL} + C_{PL} + C_{BL} + C_{SL}} \quad (3) \Rightarrow \text{LARGE } \beta_{PL}$$

$$\beta_{BL} = \frac{C_{BL}}{C_{WL} + C_{PL} + C_{BL} + C_{SL}} \quad (4) \Rightarrow \text{SMALL } \beta_{BL}$$

$$\beta_{SL} = \frac{C_{SL}}{C_{WL} + C_{PL} + C_{BL} + C_{SL}} \quad (5) \Rightarrow \text{SMALL } \beta_{SL}$$

FIG. 2C

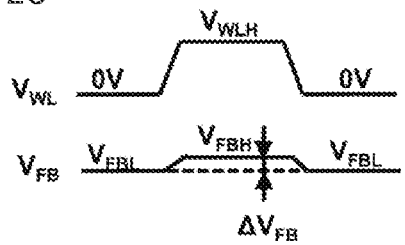

$$\Delta V_{FB} = V_{FBH} - V_{FBL}$$

$$= \underline{\beta_{WL} \times V_{WLH}} \quad (6)$$
$$\phantom{=}\text{SMALL}$$

$$V_{FB}"1" = Vb - \beta_{WL} \times Vt_{WL}"1" - \beta_{BL} \times V_{BLH} \quad (7)$$
$$\underline{\underline{\text{SMALL}}}$$

FIG. 4BA

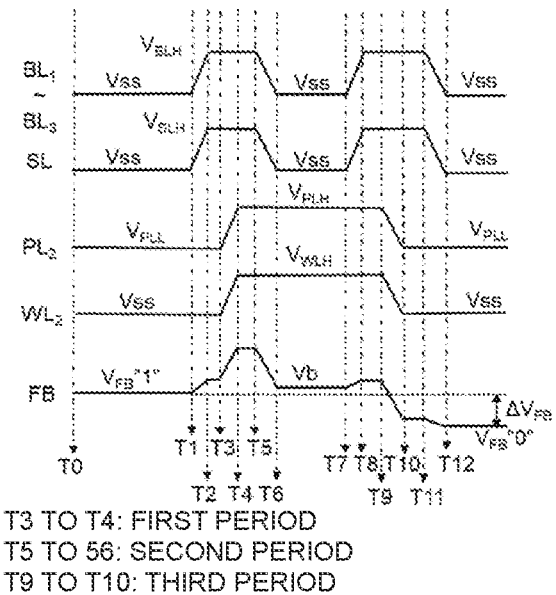

T3 TO T4: FIRST PERIOD
T5 TO 56: SECOND PERIOD
T9 TO T10: THIRD PERIOD

FIG. 4BB

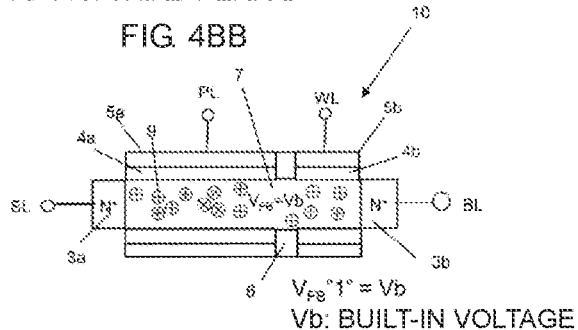

Vb: BUILT-IN VOLTAGE $$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\begin{aligned}\Delta V_{FB} &= V_{FB}\text{"1"} - V_{FB}\text{"0"} \\ &= \beta_{WL} \times V_{WLH} + \beta_{PL} \times (V_{PLH} - V_{PLL}) \\ &\quad - \beta_{WL} \times Vt_{WL}\text{"1"} - \beta_{BL} \times V_{BLH}\end{aligned} \quad (9)$$

FIG. 4BC

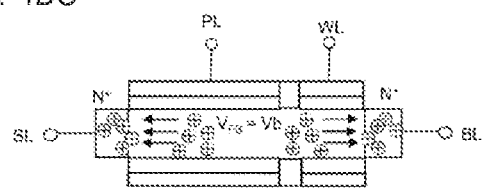

FIG. 4BD

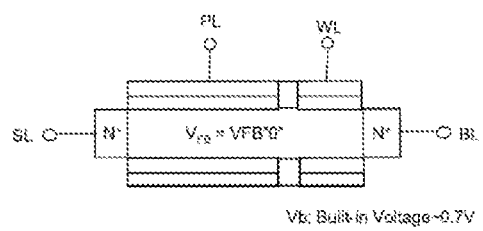

Vb: Built-in Voltage ~0.7V

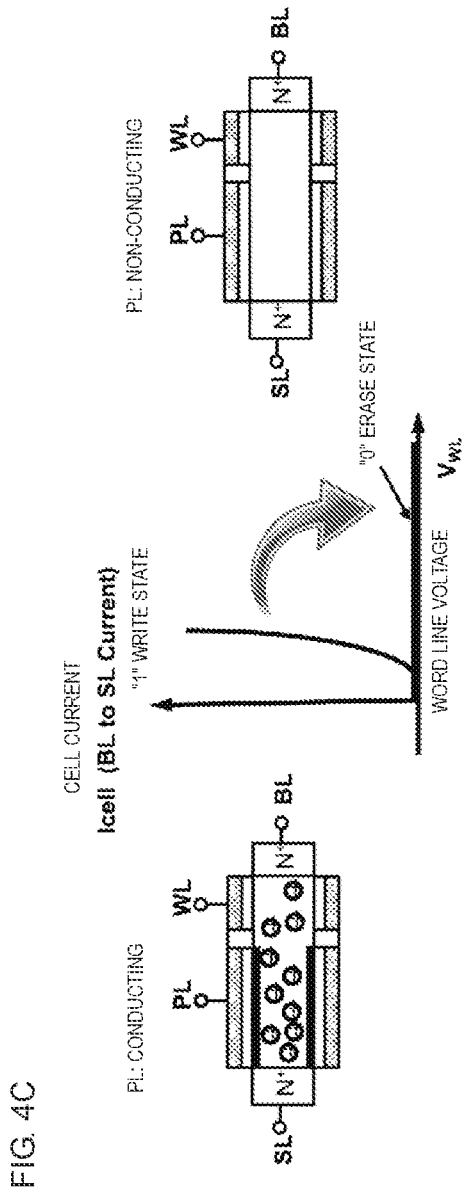

FIG. 4DA

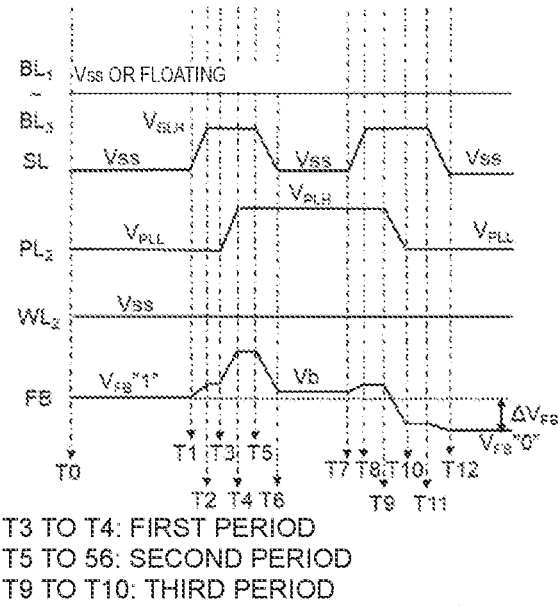

T3 TO T4: FIRST PERIOD
T5 TO 56: SECOND PERIOD
T9 TO T10: THIRD PERIOD

FIG. 4DB

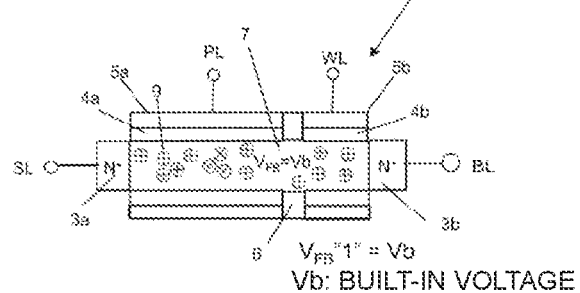

Vb: BUILT-IN VOLTAGE $$V_{FB}"1" = Vb - \beta_{WL} \times Vt_{WL}"1" - \beta_{BL} \times V_{BLH} \quad (7)$$

$$V_{FB}"0" = Vb - \beta_{WL} \times V_{WLH} - \beta_{PL} \times (V_{PLH} - V_{PLL}) \quad (8)$$

$$\Delta V_{FB} = V_{FB}"1" - V_{FB}"0"$$
$$= \beta_{WL} \times V_{WLH} + \beta_{PL} \times (V_{PLH} - V_{PLL})$$
$$- \beta_{WL} \times Vt_{WL}"1" - \beta_{BL} \times V_{BLH} \quad (9)$$

FIG. 4DC

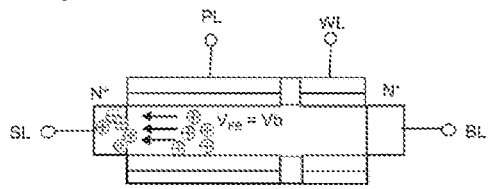

FIG. 4DD

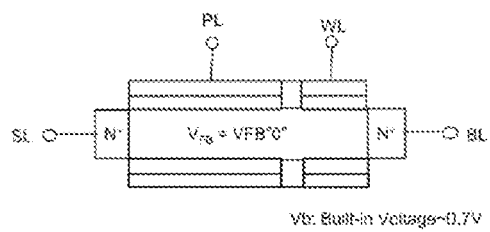

Vb: Built-in Voltage~0.7V

FIG. 4EA

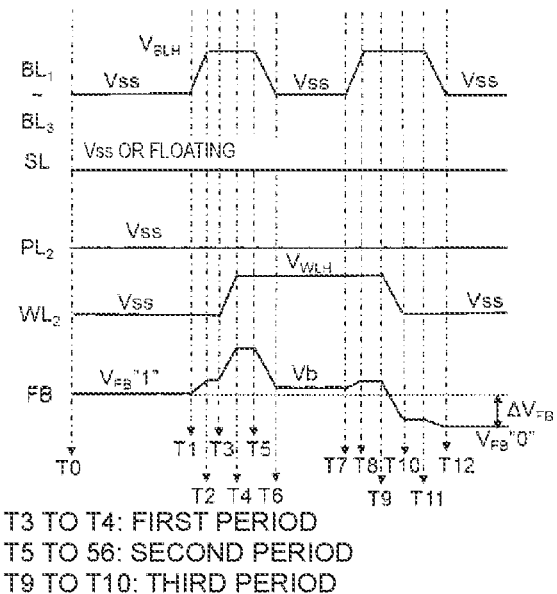

T3 TO T4: FIRST PERIOD
T5 TO 56: SECOND PERIOD
T9 TO T10: THIRD PERIOD

FIG. 4EB

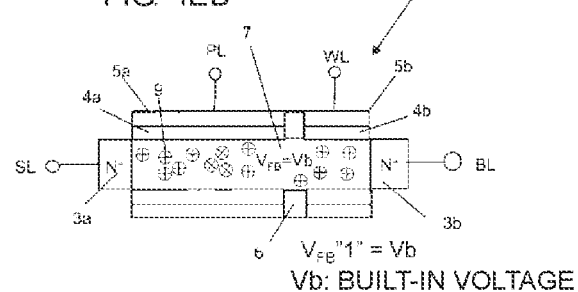

Vb: BUILT-IN VOLTAGE $$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\begin{aligned}\Delta V_{FB} &= V_{FB}\text{"1"} - V_{FB}\text{"0"} \\ &= \beta_{WL} \times V_{WLH} + \beta_{PL} \times (V_{PLH} - V_{PLL}) \\ &\quad - \beta_{WL} \times Vt_{WL}\text{"1"} - \beta_{BL} \times V_{BLH} \quad (9)\end{aligned}$$

FIG. 4EC

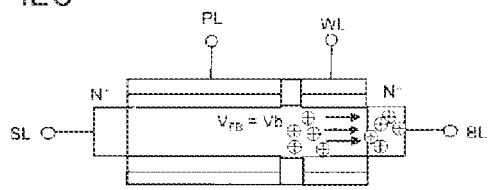

FIG. 4ED

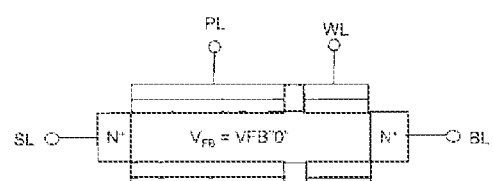

Vb: Built-in Voltage~0.7V

Vb: BUILT-IN VOLTAGE 0.7V $$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

SEMICONDUCTOR ELEMENT MEMORY DEVICE

CROSS REFERENCES TO RELATED APPLICATIONS

The present application is a Continuation-In-Part application of PCT/JP2021/008756, filed Mar. 5, 2021, the entire contents of which are incorporated herein by reference.

BACKGROUND OF THE INVENTION

1. Field of the Invention

The present invention relates to a semiconductor-element-including semiconductor memory device.

2. Description of the Related Art

Recently, there has been a demand for highly integrated and high-performance memory elements in the development of LSI (Large Scale Integration) technology.

Typical planar MOS transistors include a channel that extends in a horizontal direction along the upper surface of the semiconductor substrate. In contrast, SGTs include a channel that extends in a direction perpendicular to the upper surface of the semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Accordingly, the density of semiconductor devices can be made higher with SGTs than with planar MOS transistors. Such SGTs can be used as selection transistors to implement highly integrated memories, such as a DRAM (Dynamic Random Access Memory, see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected, a PCM (Phase Change Memory, see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance change element is connected, an RRAM (Resistive Random Access Memory, see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)), and an MRAM (Magneto-resistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the orientation of a magnetic spin with a current. Further, there exists, for example, a DRAM memory cell (see M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)) constituted by a single MOS transistor and including no capacitor. The present application relates to a dynamic flash memory that can be constituted only by a MOS transistor and that includes no resistance change element or capacitor.

FIGS. 7A to 7D illustrate a write operation of a DRAM memory cell constituted by a single MOS transistor and including no capacitor described above, FIGS. 8A and 8B illustrate a problem in the operation, and FIGS. 9A to 9C illustrate a read operation (see J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain Leakage (GIDL) Current for Low-Power and High-Speed Embedded Memory", IEEE IEDM (2006)). FIG. 7A illustrates a "1" write state. Here, the memory cell is formed on an SOI substrate 100, is constituted by a source $N^+$ layer 103 (hereinafter, a semiconductor region that contains a donor impurity in high concentrations is referred to as "$N^+$ layer") to which a source line SL is connected, a drain $N^+$ layer 104 to which a bit line BL is connected, a gate conductor layer 105 to which a word line WL is connected, and a floating body 102 of a MOS transistor 110, and includes no capacitor. The single MOS transistor 110 constitutes the DRAM memory cell. Directly under the floating body 102, a $SiO_2$ layer 101 of the SOI substrate is in contact with the floating body 102. To write "1" to the memory cell constituted by the single MOS transistor 110, the MOS transistor 110 is operated in the saturation region. That is, a channel 107, for electrons, extending from the source $N^+$ layer 103 has a pinch-off point 108 and does not reach the drain $N^+$ layer 104 to which the bit line is connected. When a high voltage is applied to both of the bit line BL connected to the drain $N^+$ layer and the word line WL connected to the gate conductor layer 105, and the MOS transistor 110 is operated at the gate voltage that is about one-half of the drain voltage, the electric field intensity becomes maximum at the pinch-off point 108 that is in the vicinity of the drain $N^+$ layer 104. As a result, accelerated electrons that flow from the source $N^+$ layer 103 toward the drain $N^+$ layer 104 collide with the Si lattice, and with kinetic energy lost at the time of collision, electron-positive hole pairs are generated (impact ionization phenomenon). Most of the generated electrons (not illustrated) reach the drain $N^+$ layer 104. Further, a very small proportion of the electrons that are very hot pass through a gate oxide film 109 and reach the gate conductor layer 105. With positive holes 106 that are simultaneously generated, the floating body 102 is charged. In this case, the generated positive holes contribute to an increase in the majority carriers because the floating body 102 is P-type Si. When the floating body 102 is filled with the generated positive holes 106 and the voltage of the floating body 102 becomes higher than that of the source $N^+$ layer 103 by Vb or more, further generated positive holes are discharged to the source $N^+$ layer 103. Here, Vb is the built-in voltage of the PN junction between the source $N^+$ layer 103 and the P-layer floating body 102 and is equal to about 0.7 V. FIG. 7B illustrates a state in which the floating body 102 is charged to saturation with the generated positive holes 106.

Now, a "0" write operation of the memory cell 110 will be described with reference to FIG. 7C. For the common selected word line WL, the memory cell 110 to which "1" is written and the memory cell 110 to which "0" is written are present at random. FIG. 7C illustrates a state of rewriting from a "1" write state to a "0" write state. To write "0", the voltage of the bit line BL is set to a negative bias, and the PN junction between the drain N$^+$ layer 104 and the P-layer floating body 102 is forward biased. As a result, the positive holes 106 in the floating body 102 generated in advance in the previous cycle flow into the drain N$^+$ layer 104 that is connected to the bit line BL. When the write operation ends, the two memory cells are in a state in which the memory cell 110 (FIG. 7B) is filled with the generated positive holes 106, and from the memory cell 110 (FIG. 7C), the generated positive holes are discharged. The potential of the floating body 102 of the memory cell 110 filled with the positive holes 106 becomes higher than that of the floating body 102 in which generated positive holes are not present. Therefore, the threshold voltage of the memory cell 110 to which "1" is written becomes lower than the threshold voltage of the memory cell 110 to which "0" is written. This is illustrated in FIG. 7D.

Now, a problem in the operation of the memory cell constituted by the single MOS transistor 110 will be described with reference to FIGS. 8A and 8B. As illustrated in FIG. 8A, the capacitance $C_{FB}$ of the floating body is equal to the sum of the capacitance $C_{WL}$ between the gate to which the word line is connected and the floating body, the junction capacitance $C_{SL}$ of the PN junction between the source N$^+$ layer 103 to which the source line is connected and the floating body 102, and the junction capacitance $C_{BL}$ of the PN junction between the drain N$^+$ layer 104 to which the bit line is connected and the floating body 102 and is expressed as follows.

$$C_{FB}=C_{WL}+C_{BL}+C_{SL} \quad (10)$$

The capacitive coupling ratio $\beta_{WL}$ between the gate to which the word line is connected and the floating body is expressed as follows.

$$\beta_{WL}=C_{WL}/(C_{WL}+C_{BL}+C_{SL}) \quad (11)$$

Therefore, a change in the word line voltage $V_{WL}$ at the time of reading or writing affects the voltage of the floating body 102 that functions as a storage node (contact point) of the memory cell. This is illustrated in FIG. 8B. When the word line voltage $V_{WL}$ rises from 0 V to $V_{WLH}$ at the time of reading or writing, the voltage $V_{FB}$ of the floating body 102 rises from $V_{FB1}$, which is the voltage in the initial state before the word line voltage changes, to $V_{FB2}$ due to capacitive coupling with the word line. The voltage change amount $\Delta V_{FB}$ is expressed as follows.

$$\Delta V_{FB}=V_{FB2}-V_{FB1}=\beta_{WL} \times V_{WLH} \quad (12)$$

Here, for $\beta_{WL}$ in expression (11), the contribution ratio of Cn is large and, for example, $C_{WL}:C_{BL}:C_{SL}=8:1:1$ holds. This results in $\beta_{WL}=0.8$. When the word line changes, for example, from 5 V at the time of writing to 0 V after the end of writing, the floating body 102 receives an amplitude noise of 5 V$\times\beta_{WL}=4$ V due to capacitive coupling between the word line WL and the floating body 102. Accordingly, a sufficient margin is not provided to the potential difference between the "1" potential and the "0" potential of the floating body 102 at the time of writing, which has been a problem.

FIGS. 9A to 9C illustrate a read operation where FIG. 9A illustrates a "1" write state and FIG. 9B illustrates a "0" write state. In actuality, however, even when Vb is set for the floating body 102 to write "1", once the word line returns to 0 V at the end of writing, the floating body 102 is lowered to a negative bias. When "0" is written, the floating body 102 is lowered to a further negative bias, and it is difficult to provide a sufficiently large margin to the potential difference between "1" and "0" at the time of writing as illustrated in FIG. 9C. Therefore, there has been difficulty in commercially introducing DRAM memory cells actually including no capacitor.

SUMMARY OF THE INVENTION

In capacitor-less single-transistor DRAMs (gain cells), capacitive coupling between the word line and the floating body is strong. When the potential of the word line is changed at the time of data reading or at the time of data writing, the change is directly transmitted to the floating body as noise, which has been a problem. This causes a problem of erroneous reading or erroneous rewriting of storage data, and it has been difficult to commercially introduce capacitor-less single-transistor DRAMs (gain cells).

To address the above-described problems, a semiconductor element memory device according to the present invention includes a plurality of pages disposed in lines, each of the pages being constituted by a plurality of memory cells arranged in columns on a substrate, each of the memory cells included in each of the pages including:
a semiconductor body that stands on the substrate in a vertical direction relative to the substrate or that extends along the substrate in a horizontal direction relative to the substrate;
a first impurity region and a second impurity region that are disposed at respective ends of the semiconductor body;
a gate insulator layer that is in contact with a side surface of the semiconductor body between the first impurity region and the second impurity region;
a first gate conductor layer that partially or entirely covers the gate insulator layer; and
a second gate conductor layer that is adjacent to the first gate conductor layer and that is in contact with a side surface of the gate insulator layer, in which
in each of the memory cells,
voltages applied to the first gate conductor layer, the second gate conductor layer, the first impurity region, and the second impurity region are controlled to retain a group of positive holes, generated by an impact ionization phenomenon or a gate-induced drain leakage current, inside the semiconductor body,
in a page write operation, a voltage of the semiconductor body is made equal to a first data retention voltage that is higher than the voltage of one of the first impurity region or the second impurity region or the voltages of both of the first impurity region and the second impurity region,
in each of the memory cells that constitute a page among the pages,
the voltage of the semiconductor body is controlled so as to be higher than the first data retention voltage with one or both of first capacitive coupling between the first gate conductor layer and the semiconductor body and second capacitive coupling between the second gate conductor layer and the semiconductor body, and the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region, in a page erase operation, the voltage of the semiconductor body is made equal to a second data retention voltage lower than the first data retention voltage with the first capacitive coupling and the second capacitive coupling, and in the page erase operation, at least two or more pages are simultaneously selected from among the pages and a multi-page erase operation is performed (first invention).

In the first invention described above,
in the page erase operation,
the voltage of the first gate conductor layer is increased from a first voltage to a second voltage higher than the first voltage, or the voltage of the second gate conductor layer is increased from a third voltage to a fourth voltage higher than the third voltage, in a first period, the voltage of the semiconductor body is controlled so as to be higher than the first data retention voltage with the first capacitive coupling and the second capacitive coupling, in a second period, the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by a built-in voltage, and in a third period, the voltage of the semiconductor body is made equal to the second data retention voltage lower than the first data retention voltage with the first capacitive coupling and the second capacitive coupling (second invention).

In the first invention described above, in a page, among the pages, in which a plurality of the semiconductor bodies are arranged in columns, in the page erase operation, the page erase operation is performed for all of the semiconductor bodies in the page simultaneously (third invention).

In the second invention described above, with application of the voltages to the first impurity region and the second impurity region and with one or both of the first capacitive coupling and the second capacitive coupling, an inversion layer is not formed in the semiconductor body in the first period, a part of the second period, and the third period in which the voltage of the semiconductor body is changed (fourth invention).

In the first invention described above, a first gate capacitance between the first gate conductor layer and the semiconductor body is made larger than a second gate capacitance between the second gate conductor layer and the semiconductor body (fifth invention).

In the first invention described above, the group of positive holes are discharged from inside the semiconductor body through one of the first impurity region or the second impurity region, and the other of the first impurity region or the second impurity region is put in a floating state (sixth invention).

A semiconductor element memory device according to the present invention includes a block in which the plurality of pages in the semiconductor element memory device according to the first invention are disposed, in which the first impurity region of each of the memory cells included in each of the plurality of pages is connected to a source line, the second impurity region thereof is connected to a corresponding one of bit lines, one of the first gate conductor layer or the second gate conductor layer thereof is connected to a corresponding one of word lines, and the other of the first gate conductor layer or the second gate conductor layer is connected to a corresponding one of driving control lines, the source line is connected to the semiconductor bodies in the block, and voltages are applied to the source line, the bit lines, the driving control lines, and the word lines to perform the page erase operation of discharging the group of positive holes in all of the semiconductor bodies in a page selected from among the pages in the block (seventh invention).

In the seventh invention described above, a row address is decoded by a word line decoder circuit to select a word line from among the word lines, the word line decoder circuit includes a word line address latch circuit, and at least two or more word lines are selected in the multi-page erase operation (eighth invention).

In the seventh invention described above, a row address is decoded by a driving control line decoder circuit to select a driving control line from among the driving control lines, the driving control line decoder circuit includes a driving control line address latch circuit, and at least two or more driving control lines are selected in the multi-page erase operation (ninth invention).

In the eighth invention described above, to the word line address latch circuit, an all-word-line selection signal is input, and all of the word lines in the block are selected in the multi-page erase operation (tenth invention).

In the ninth invention described above, to the driving control line address latch circuit, an all-driving-control-line selection signal is input, and all of the driving control lines in the block are selected in the multi-page erase operation (eleventh invention).

In the first invention described above, one or both of the first gate conductor layer and the second gate conductor layer is divided into two or more isolated gate conductor layers in plan view or in the vertical direction, and the isolated gate conductor layers are operated synchronously or asynchronously (twelfth invention).

In the twelfth invention described above, in the vertical direction, the isolated gate conductor layers obtained from one of the first gate conductor layer or the second gate conductor layer are disposed on respective sides of the other of the first gate conductor layer or the second gate conductor layer (thirteenth invention).

BRIEF DESCRIPTION OF THE DRAWINGS

FIGS. 2A to 2C are diagrams for explaining an effect attained in a case where the gate capacitance of a first gate conductor layer 5a connected to a plate line PL is made larger than the gate capacitance of a second gate conductor layer 5b to which a word line WL is connected in the SGT-including memory device according to the first embodiment;

FIGS. 4BA to 4BD are diagrams for explaining the mechanism of the page erase operation of the SGT-including memory device according to the first embodiment;

FIG. 4C includes diagrams for explaining the mechanism of the page erase operation of the SGT-including memory device according to the first embodiment;

FIGS. 4DA to 4DD are diagrams for explaining a mechanism of the page erase operation of the SGT-including memory device according to the first embodiment;

FIGS. 4EA to 4ED are diagrams for explaining a mechanism of the page erase operation of the SGT-including memory device according to the first embodiment;

DESCRIPTION OF THE PREFERRED EMBODIMENTS

Hereinafter, a semiconductor-element-including memory device (hereinafter called a dynamic flash memory) according to the present invention will be described with reference to the drawings.

First Embodiment

The structure and operation mechanisms of a dynamic flash memory cell according to a first embodiment of the present invention will be described with reference to FIG. 1 to FIGS. 5A to 5C. The structure of the dynamic flash memory cell will be described with reference to FIG. 1. An effect attained in a case where the gate capacitance of a first gate conductor layer 5a connected to a plate line PL is made larger than the gate capacitance of a second gate conductor layer 5b to which a word line WL is connected will be described with reference to FIGS. 2A to 2C. A mechanism of a data write operation will be described with reference to FIGS. 3AA to 3AC and FIG. 3B, mechanisms of a data erase operation will be described with reference to FIG. 4A to FIGS. 4EA to 4ED, and a mechanism of a data read operation will be described with reference to FIGS. 5A to 5C.

Figure 1:
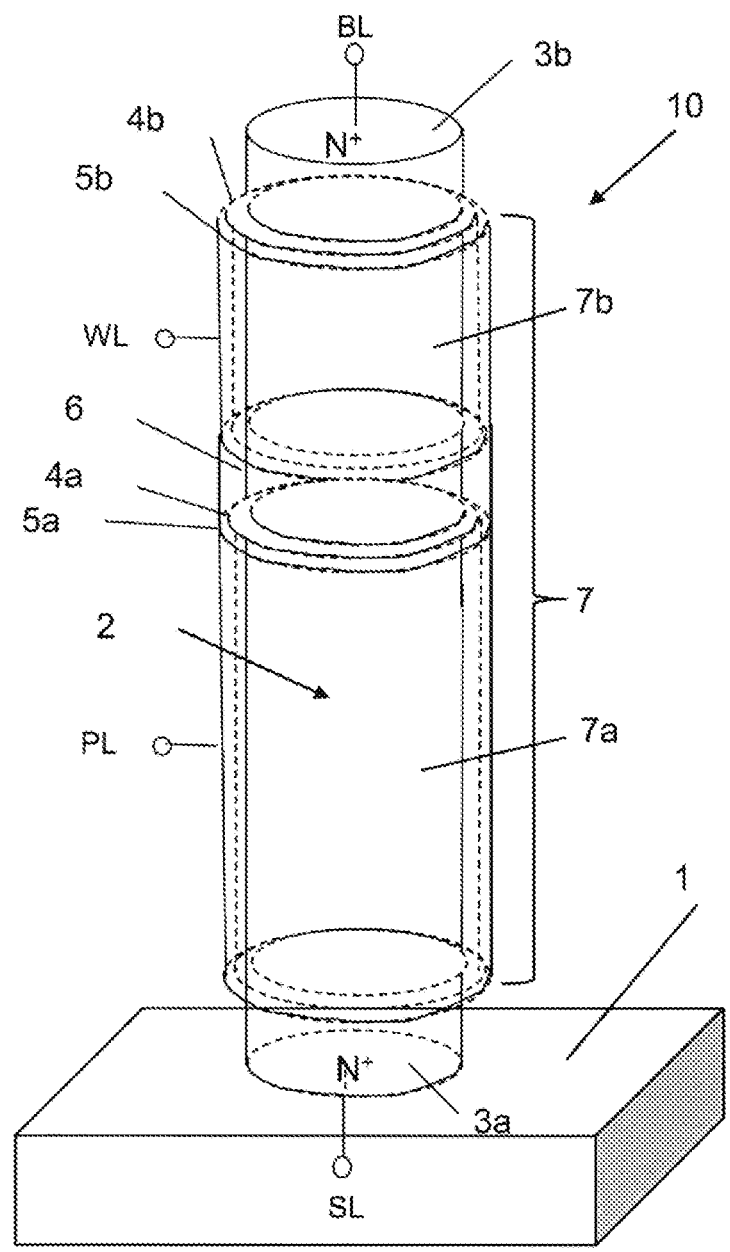
FIG. 1 is a structural diagram of an SGT-including memory device according to a first embodiment.

FIG. 1 illustrates the structure of the dynamic flash memory cell according to the first embodiment of the present invention. At top and bottom positions in a silicon semiconductor column 2 (the silicon semiconductor column is hereinafter referred to as "Si column") (which is an example of "semiconductor body" in the claims) of the P or i (intrinsic) conductivity type formed on a substrate 1 (which is an example of "substrate" in the claims), $N^+$ layers 3a and 3b (which are examples of "first impurity region" and "second impurity region" in the claims), one of which functions as the source and the other functions as the drain, are formed. A part of the Si column 2 between the N+layers 3a and 3b that function as the source and the drain functions as a semiconductor body 7 (which is an example of "semiconductor body" in the claims). Around the semiconductor body 7, a first gate insulator layer 4a (which is an example of "gate insulator layer" in the claims) and a second gate insulator layer 4b (which is an example of "gate insulator layer" in the claims) are formed. The first gate insulator layer 4a and the second gate insulator layer 4b are in contact with or in close vicinity to the $N^+$ layers 3a and 3b that function as the source and the drain respectively. Around the first gate insulator layer 4a and the second gate insulator layer 4b, the first gate conductor layer 5a (which is an example of "first gate conductor layer" in the claims) and the second gate conductor layer 5b (which is an example of "second gate conductor layer" in the claims) are formed respectively. The first gate conductor layer 5a and the second gate conductor layer 5b are isolated from each other by an insulating layer 6 (which is also referred to as "first insulating layer"). The semiconductor body 7 between the $N^+$ layers 3a and 3b is constituted by a first channel Si layer 7a (which is also referred to as "first semiconductor body") surrounded by the first gate insulator layer 4a and a second channel Si layer 7b (which is also referred to as "second semiconductor body") surrounded by the second gate insulator layer 4b. Accordingly, the $N^+$ layers 3a and 3b that function as the source and the drain, the semiconductor body 7, the first gate insulator layer 4a, the second gate insulator layer 4b, the first gate conductor layer 5a, and the second gate conductor layer 5b constitute a dynamic flash memory cell 10. The $N^+$ layer 3a that functions as the source is connected to a source line SL (which is an example of "source line" in the claims), the $N^+$ layer 3b that functions as the drain is connected to a bit line BL (which is an example of "bit line" in the claims), the first gate conductor layer 5a is connected to the plate line PL (which is an example of "driving control line" in the claims), and the second gate conductor layer 5b is connected to the word line WL (which is an example of "word line" in the claims). Desirably, the dynamic flash memory cell has a structure in which the gate capacitance of the first gate conductor layer 5a to which the plate line PL is connected is larger than the gate capacitance of the second gate conductor layer 5b to which the word line WL is connected.

In FIG. 1, to make the gate capacitance of the first gate conductor layer 5a connected to the plate line PL larger than the gate capacitance of the second gate conductor layer 5b to which the word line WL is connected, the gate length of the first gate conductor layer 5a is made longer than the gate length of the second gate conductor layer 5b. Alternatively, instead of making the gate length of the first gate conductor layer 5a longer than the gate length of the second gate conductor layer 5b, the thicknesses of the respective gate insulator layers may be made different such that the thickness of the gate insulating film of the first gate insulator layer 4a is thinner than the thickness of the gate insulating film of the second gate insulator layer 4b. Alternatively, the dielectric constants of the materials of the respective gate insulator layers may be made different such that the dielectric constant of the gate insulating film of the first gate insulator layer 4a is higher than the dielectric constant of the gate insulating film of the second gate insulator layer 4b. The gate capacitance of the first gate conductor layer 5a connected to the plate line PL may be made larger than the gate capacitance of the second gate conductor layer 5b to which the word line WL is connected, by a combination of any of the lengths of the gate conductor layers 5a and 5b and the thicknesses and dielectric constants of the gate insulator layers 4a and 4b.

FIGS. 2A to 2C are diagrams for explaining an effect attained in a case where the gate capacitance of the first gate conductor layer 5a connected to the plate line PL is made larger than the gate capacitance of the second gate conductor layer 5b to which the word line WL is connected.

FIG. 2A is a simplified structural diagram of the dynamic flash memory cell according to the first embodiment of the present invention and illustrates only main parts. To the dynamic flash memory cell, the bit line BL, the word line WL, the plate line PL, and the source line SL are connected, and the potential state of the semiconductor body 7 is determined by the voltage states of the lines.

FIG. 2B is a diagram for explaining the capacitance relationships of the respective lines. The capacitance Cps of the semiconductor body 7 is equal to the sum of the capacitance $C_{WL}$ between the gate conductor layer 5b to which the word line WL is connected and the semiconductor body 7, the capacitance $C_{PL}$ between the gate conductor layer 5a to which the plate line PL is connected and the semiconductor body 7, the junction capacitance $C_{SL}$ of the PN junction between the source N+ layer 3a to which the source line SL is connected and the semiconductor body 7, and the junction capacitance $C_{BL}$ of the PN junction between the drain N+ layer 3b to which the bit line BL is connected and the semiconductor body 7, and is expressed as follows.

$$C_{FB}=C_{WL}+C_{PL}+C_{BL}+C_{SL} \quad (1)$$

Therefore, the coupling ratio $\beta_{WL}$ between the word line WL and the semiconductor body 7, the coupling ratio $\beta_{PL}$ between the plate line PL and the semiconductor body 7, the coupling ratio $R_{BL}$ between the bit line BL and the semiconductor body 7, and the coupling ratio $\beta_{SL}$ between the source line SL and the semiconductor body 7 are expressed as follows.

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Here, $C_{PL}>C_{WL}$ holds, and therefore, this results in $\beta_{PL}>\beta_{WL}$.

FIG. 2C is a diagram for explaining a change in the voltage VFs of the semiconductor body 7 when the voltage $V_{WL}$ of the word line WL rises at the time of a read operation or a write operation and subsequently drops. Here, the potential difference $\Delta V_{FB}$ when the voltage $V_{FB}$ of the semiconductor body 7 transitions from a low-voltage state $V_{FBL}$ to a high-voltage state $V_{FBH}$ in response to the voltage $V_{WL}$ of the word line WL rising from 0 V to a high-voltage state $V_{WLH}$ is expressed as follows.

$$\Delta V_{FB}=V_{FBH}-V_{FBL}=\beta_{WL} \times V_{WLH} \quad (6)$$

The coupling ratio $\beta_{WL}$ between the word line WL and the semiconductor body 7 is small and the coupling ratio $\beta_{PL}$ between the plate line PL and the semiconductor body 7 is large, and therefore, $\Delta V_{FB}$ is small, and the voltage $V_{FB}$ of the semiconductor body 7 negligibly changes even when the voltage $V_{WL}$ of the word line WL changes at the time of a read operation or a write operation.

Figure 3A:
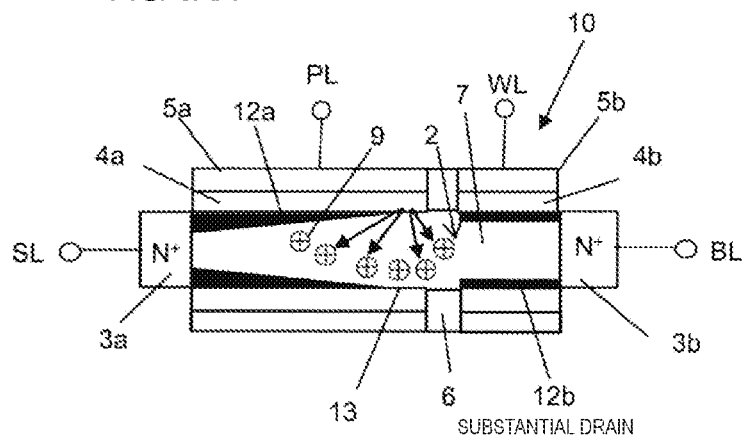
FIGS. 3AA to 3AC are diagrams for explaining a mechanism of a write operation of the SGT-including memory device according to the first embodiment.
Figure 3A:
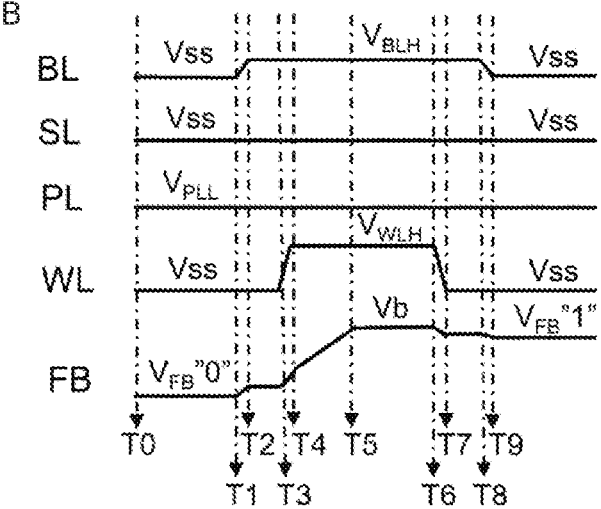
Figure 3A:
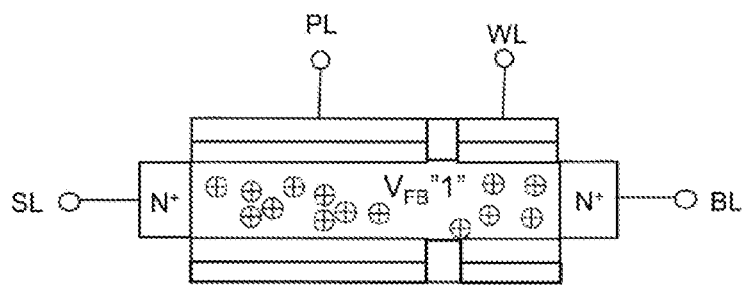
Figure 3B:
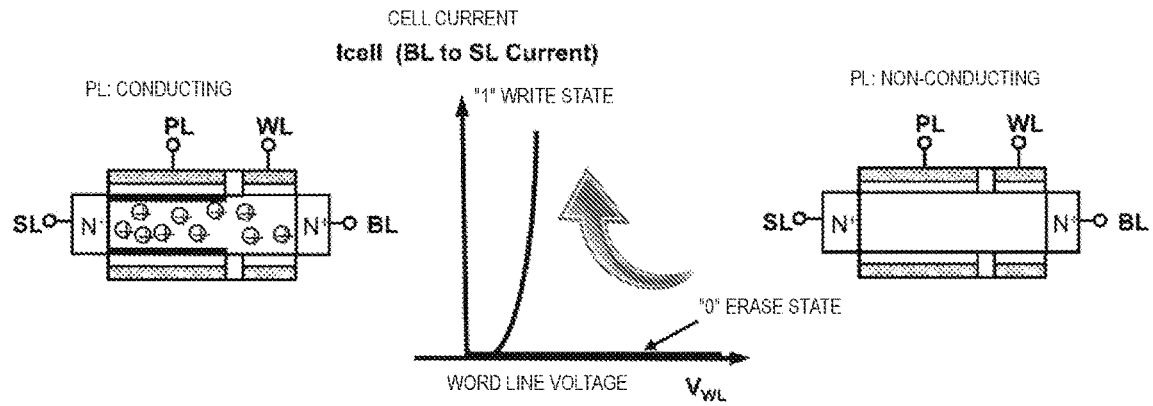
FIG. 3B includes diagrams for explaining the mechanism of the write operation of the SGT-including memory device according to the first embodiment.

FIGS. 3AA to 3AC and FIG. 3B illustrate a page write operation (which is an example of "page write operation" in the claims) for the dynamic flash memory cell according to the first embodiment of the present invention. FIG. 3AA illustrates a mechanism of the write operation, and FIG. 3AB illustrates operation waveforms of the bit line BL, the source line SL, the plate line PL, the word line WL, and the semiconductor body 7 that functions as a floating body FB. At time T0, the dynamic flash memory cell is in a "0" erase state, and the voltage of the semiconductor body 7 is equal to $V_{FB}$"0". Vss is applied to the bit line BL, the source line SL, and the word line WL, and $V_{PLL}$ is applied to the plate line PL. Here, for example, Vss is equal to 0 V and $V_{PLL}$ is equal to 2 V. Subsequently, from time T1 to time T2, when the bit line BL rises from Vas to $V_{BLH}$, in a case where, for example, Vss is equal to 0 V, the voltage of the semiconductor body 7 becomes equal to $V_{FB}$"0"$+\beta_{BL} \times V_{BLH}$ due to capacitive coupling between the bit line BL and the semiconductor body 7.

The description of the write operation for the dynamic flash memory cell will be continued with reference to FIGS. 3AA and 3AB. From time T3 to time T4, the word line WL rises from Vss to $V_{WLH}$. Accordingly, when the threshold voltage for a "0" erase state of a second N-channel MOS transistor region in which the second gate conductor layer 5b to which the word line WL is connected surrounds the semiconductor body 7 is denoted by $Vt_{WL}$"0", as the voltage of the word line WL rises, in a range from Vss to $Vt_{WL}$"0", the voltage of the semiconductor body 7 becomes equal to $V_{FB}$"0"$+\beta_{BL} \times V_{BLH}+\beta_{WL} \times Vt_{WL}$"0" due to second capacitive coupling (which is an example of "second capacitive coupling" in the claims) between the word line WL and the semiconductor body 7. When the voltage of the word line WL rises to $Vt_{WL}$"0" or above, an inversion layer 12b in a ring form is formed in the semiconductor body 7 on the inner periphery of the second gate conductor layer 5b and interrupts the second capacitive coupling between the word line WL and the semiconductor body 7.

The description of the write operation for the dynamic flash memory cell will be continued with reference to FIGS. 3AA and 3AB. From time T3 to time T4, for example, a fixed voltage $V_{PLL}$=2 V is applied to the first gate conductor layer 5a to which the plate line PL is connected, and the second gate conductor layer 5b to which the word line WL is connected is raised to, for example, $V_{WLH}$=4 V. As a result, as illustrated in FIG. 3AA, an inversion layer 12a in a ring form is formed in the semiconductor body 7 on the inner periphery of the first gate conductor layer 5a to which the plate line PL is connected, and a pinch-off point 13 is present in the inversion layer 12a. As a result, a first N-channel MOS transistor region having the first gate conductor layer 5a operates in the saturation region. In contrast, the second N-channel MOS transistor region having the second gate conductor layer 5b to which the word line WL is connected operates in the linear region. As a result, a pinch-off point is not present in the semiconductor body 7 on the inner periphery of the second gate conductor layer 5b to which the word line WL is connected, and the inversion layer 12b is formed on the entire inner periphery of the gate conductor layer 5b. The inversion layer 12b that is formed on the entire inner periphery of the second gate conductor layer 5b to which the word line WL is connected substantially functions as the drain of the second N-channel MOS transistor region having the second gate conductor layer 5b. As a result, the electric field becomes maximum in a first boundary region of the semiconductor body 7 between the first N-channel MOS transistor region having the first gate conductor layer 5a and the second N-channel MOS transistor region having the second gate conductor layer 5b that are connected in series, and an impact ionization phenomenon occurs in this region. This region is a source-side region when viewed from the second N-channel MOS transistor region having the second gate conductor layer 5b to which the word line WL is connected, and therefore, this phenomenon is called a source-side impact ionization phenomenon. By this source-side impact ionization phenomenon, electrons flow from the N⁺ layer 3a to which the source line SL is connected toward the N⁺ layer 3b to which the bit line is connected. The accelerated electrons collide with lattice Si atoms, and electron-positive hole pairs are generated by the kinetic energy. Although some of the generated electrons flow into the first gate conductor layer 5a and into the second gate conductor layer 5b, most of the generated electrons flow into the N⁺ layer 3b to which the bit line BL is connected (not illustrated).

As illustrated in FIG. 3AC, a generated group of positive holes 9 (which is an example of "group of positive holes" in the claims) are majority carriers in the semiconductor body 7, with which the semiconductor body 7 is charged to a positive bias. The N⁺ layer 3a to which the source line SL is connected is at 0 V, and therefore, the semiconductor body 7 is charged up to the built-in voltage Vb (about 0.7 V) of the PN junction between the N⁺ layer 3a to which the source line SL is connected and the semiconductor body 7. When the semiconductor body 7 is charged to a positive bias, the threshold voltages of the first N-channel MOS transistor region and the second N-channel MOS transistor region decrease due to a substrate bias effect.

The description of the write operation for the dynamic flash memory cell will be continued with reference to FIG. 3AB. From time T6 to time T7, the voltage of the word line WL drops from $V_{WLH}$ to Vss. During this period, although the second capacitive coupling is formed between the word line WL and the semiconductor body 7, the inversion layer 12b interrupts the second capacitive coupling until the voltage of the word line WL drops from $V_{WLH}$ to a threshold voltage $Vt_{WL}$"1" of the second N-channel MOS transistor region or below when the voltage of the semiconductor body 7 is equal to Vb. Therefore, the capacitive coupling between the word line WL and the semiconductor body 7 is substantially formed only during a period from when the word line WL drops to $Vt_{WL}$"1" or below to when the word line WL drops to Vss. As a result, the voltage of the semiconductor body 7 becomes equal to Vb−$Pw_L$×$Vt_{WL}$"1". Here, $Vt_{WL}$"1" is lower than $Vt_{WL}$"0" described above, and $β_{WL}$×$Vt_{WL}$"1" is small.

The description of the write operation for the dynamic flash memory cell will be continued with reference to FIG. 3AB. From time T8 to time T9, the bit line BL drops from $V_{BLH}$ to Vss. The bit line BL and the semiconductor body 7 are capacitively coupled with each other, and therefore, the "1" write voltage $V_{FB}$"1" of the semiconductor body 7 becomes as follows at the end.

$$V_{FB}\text{"1"}=Vb-β_{WL}×Vt_{WL}\text{"1"}-β_{BL}×V_{BLH} \quad (7)$$

Here, the coupling ratio $β_{BL}$ between the bit line BL and the semiconductor body 7 is also small. Accordingly, as illustrated in FIG. 3B, the threshold voltage of the second N-channel MOS transistor region of the second semiconductor body 7b to which the word line WL is connected decreases. The memory write operation (which is an example of "page write operation" in the claims) in which the voltage $V_{FB}$"1" in the "1" write state of the semiconductor body 7 is assumed to be a first data retention voltage (which is an example of "first data retention voltage" in the claims) is performed to assign logical storage data "1".

At the time of the write operation, electron-positive hole pairs may be generated by an impact ionization phenomenon in a second boundary region between the first impurity region 3a and the first semiconductor body 7a or in a third boundary region between the second impurity region 3b and the second semiconductor body 7b instead of the first boundary region, and the semiconductor body 7 may be charged with the generated group of positive holes 9.

Mechanisms of a page erase operation (which is an example of "page erase operation" in the claims) will be described with reference to FIG. 4A to FIGS. 4EA to 4ED.

Figure 4A:
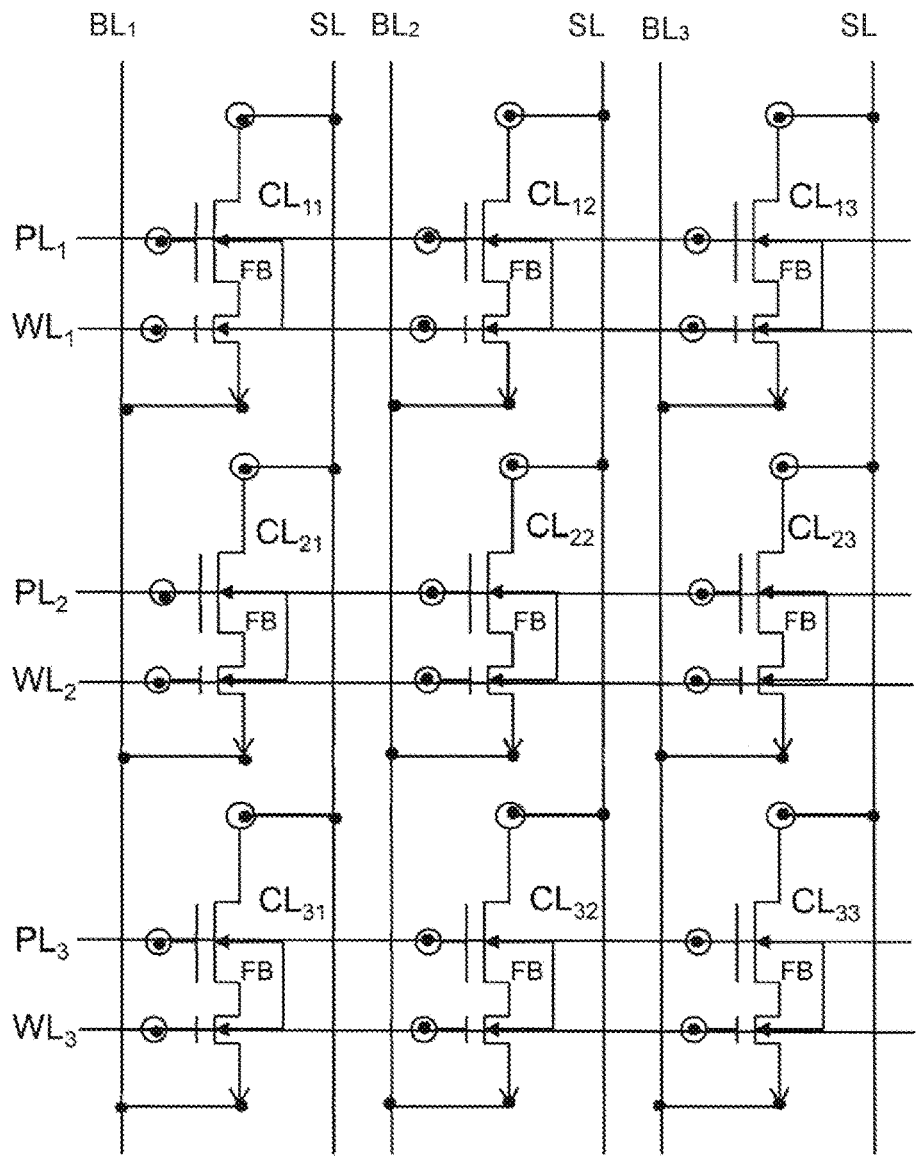
FIG. 4A is a diagram for explaining a mechanism of a page erase operation of the SGT-including memory device according to the first embodiment.

FIG. 4A is a memory block circuit diagram for explaining the page erase operation. Although nine memory cells $CL_{11}$ to $CL_{33}$ in three rows and three columns are illustrated, the actual memory block is larger than this matrix. When memory cells are arranged in a matrix, one of the directions of the arrangement is called a row direction (or in rows) and the direction perpendicular to the one of the directions is called "column direction" (or in columns). To each of the memory cells, the source line SL, a corresponding one of the bit lines $BL_1$ to $BL_3$, a corresponding one of the plate lines $PL_1$ to $PL_3$, and a corresponding one of the word lines $WL_1$ to $WL_3$ are connected. For example, it is assumed that the memory cells $CL_{21}$ to $CL_{23}$ to which the plate line $PL_2$ and the word line $WL_2$ are connected are selected in this block and the page erase operation is performed.

A mechanism of the page erase operation will be described with reference to FIGS. 4BA to 4BD and FIG. 4C. Here, the semiconductor body 7 between the N⁺ layers 3a and 3b is electrically isolated from the substrate and functions as a floating body. FIG. 4BA is a timing operation waveform diagram of main nodes in the erase operation. In FIG. 4BA, T0 to T12 indicate times from the start to the end of the erase operation. FIG. 4BB illustrates a state at time T0 before the erase operation, in which the group of positive holes 9 generated by an impact ionization phenomenon in the previous cycle are stored in the semiconductor body 7. From time T1 to time T2, the bit lines $BL_1$ to $BL_3$ and the source line SL rise from Vss to $V_{BLH}$ and $V_{SLS}$ respectively and are in a high-voltage state. Here, Vss is, for example, equal to 0 V. In this operation, during the subsequent period from time T3 to time T4 (which is an example of "first period" in the claims), the plate line $PL_2$ selected in the page erase operation rises from a first voltage $V_{PLL}$ (which is an example of "first voltage" in the claims) to a second voltage $V_{PLH}$ (which is an example of "second voltage" in the claims) and is in a high-voltage state, the word line $WL_2$ selected in the page erase operation rises from a third voltage Vss (which is an example of "third voltage" in the claims) to a fourth voltage $Vx_{LH}$ (which is an example of "fourth voltage" in the claims) and is in a high-voltage state, and this prevents the inversion layer 12a (which is an example of "inversion layer" in the claims) on the inner periphery of the first gate conductor layer 5a to which the plate line PL$_2$ is connected and the inversion layer 12b on the inner periphery of the second gate conductor layer 5b to which the word line WL$_2$ is connected from being formed in the semiconductor body 7. Therefore, when the threshold voltage of the second N-channel MOS transistor region on the side of the word line WL$_2$ and the threshold voltage of the first N-channel MOS transistor region on the side of the plate line PL$_2$ are denoted by V$_{tWL}$ and V$_{tPL}$ respectively, it is desirable that the voltages V$_{BLH}$ and V$_{SLH}$ satisfy V$_{BLH}$>V$_{WLH}$+V$_{tWL}$ and V$_{SLH}$>V$_{PLH}$+V$_{tPL}$. For example, in a case where V$_{tWL}$ and V$_{tPL}$ are equal to 0.5 V, V$_{WLH}$ and V$_{PLH}$ need to be set to 3 V, and V$_{BLH}$ and V$_{SLH}$ need to be set to 3.5 V or higher.

The description of the mechanism of the page erase operation illustrated in FIG. 4BA will be continued. As the plate line PL$_2$ and the word line WL$_2$ respectively rise to the second voltage V$_{PLH}$ and the fourth voltage Vim and are in a high-voltage state during the first period from time T3 to time T4, the voltage of the semiconductor body 7 in a floating state is increased due to first capacitive coupling (which is an example of "first capacitive coupling" in the claims) between the plate line PL$_2$ and the semiconductor body 7 and second capacitive coupling between the word line WL$_2$ and the semiconductor body 7. The voltage of the semiconductor body 7 rises from V$_{FB}$"1" in the "1" write state to a high voltage. This voltage rise is possible because the voltage of the bit lines BL$_1$ to BL$_3$ and that of the source line SL are high voltages of V$_{BLH}$ and V$_{SLH}$ respectively and the PN junction between the source N$^+$ layer 3a and the semiconductor body 7 and the PN junction between the drain N$^+$ layer 3b and the semiconductor body 7 are in a reverse bias state accordingly.

The description of the mechanism of the page erase operation illustrated in FIG. 4BA will be continued. During the subsequent period from time T5 to time T6 (which is an example of "second period" in the claims), the voltage of the bit lines BL$_1$ to BL$_3$ and that of the source line SL respectively drop from high voltages of V$_{BLH}$ and V$_{SLH}$ to Vss. As a result, the PN junction between the source N$^+$ layer 3a and the semiconductor body 7 and the PN junction between the drain N$^+$ layer 3b and the semiconductor body 7 are in a forward bias state as illustrated in FIG. 4BC, and a group of remaining positive holes among the group of positive holes 9 in the semiconductor body 7 are discharged to the source N$^+$ layer 3a and to the drain N$^+$ layer 3b. As a result, the voltage V$_{FB}$ of the semiconductor body 7 becomes equal to the built-in voltage Vb of the PN junction formed by the source N$^+$ layer 3a and the P-layer semiconductor body 7 and the PN junction formed by the drain N$^+$ layer 3b and the P-layer semiconductor body 7.

The description of the mechanism of the page erase operation illustrated in FIG. 4BA will be continued. Subsequently, from time T7 to time T8, the voltage of the bit lines BL$_1$ to BL$_3$ and that of the source line SL rise from Vss to high voltages of Va$_B$a and Vs$_L$a respectively. With this operation, as illustrated in FIG. 4BD, when the plate line PL$_2$ drops from the second voltage V$_{PLH}$ to the first voltage V$_{PLL}$ and the word line WL$_2$ drops from the fourth voltage V$_{WLH}$ to the third voltage Vss from time T9 to time T10 (which is an example of "third period" in the claims), the voltage V$_{FB}$ of the semiconductor body 7 efficiently changes from Vb to V$_{FB}$"0" due to the first capacitive coupling between the plate line PL$_2$ and the semiconductor body 7 and the second capacitive coupling between the word line WL$_2$ and the semiconductor body 7 without the inversion layer 12a on the side of the plate line PL$_2$ or the inversion layer 12b on the side of the word line WL$_2$ being formed in the semiconductor body 7. The voltage difference ΔV$_{FB}$ of the semiconductor body 7 between the "1" write state and the "0" erase state is expressed by the following expressions.

$$V_{FB}\text{"1"}=Vb-\beta_{WL}\times Vt_{WL}\text{"1"}-\beta_{BL}\times V_{BLH} \quad (7)$$

$$V_{FB}\text{"0"}=Vb-\beta_{WL}\times V_{WLH}-\beta_{PL}\times(V_{PLH}-V_{PLL}) \quad (8)$$

$$\Delta V_{FB}=V_{FB}\text{"1"}-V_{FB}\text{"0"}=\beta_{WL}\times V_{WLH}+\beta_{PL}\times(V_{PLH}-V_{PLL})-\beta_{WL}\times Vt_{WL}\text{"1"}-\beta_{BL}\times V_{BLH} \quad (9)$$

Here, the sum of β$_{WL}$ and β$_{PL}$ is greater than or equal to 0.8, ΔV$_{FB}$ is large, and a sufficient margin is provided.

As a result, as illustrated in FIG. 4C, a large margin is provided between the "1" write state and the "0" erase state. Here, in the "0" erase state, the threshold voltage on the side of the plate line PL$_2$ is high due to a substrate bias effect. Therefore, when the voltage applied to the plate line PL$_2$ is set to, for example, the threshold voltage or lower, the first N-channel MOS transistor region on the side of the plate line PL$_2$ becomes non-conducting and does not allow the memory cell current to flow therethrough. This state is illustrated in the right part of FIG. 4C and indicated as "PL: non-conducting".

The description of the mechanism of the page erase operation illustrated in FIG. 4BA will be continued. Subsequently, during a fourth period from time T11 to time T12, the voltage of the bit lines BL$_1$ to BL$_3$ drops from V$_{BLH}$ to Vss and that of the source line SL drops from V$_{SLH}$ to Vss, and the erase operation ends. At this time, although the bit lines BL$_1$ to BL$_3$ and the source line SL slightly decrease the voltage of the semiconductor body 7 due to capacitive coupling, this decrease is equal to the increase in the voltage of the semiconductor body 7 by the bit lines BL$_1$ to BL$_3$ and the source line SL from time T7 to time T8 due to capacitive coupling, and therefore, the decrease and the increase in the voltage by the bit lines BL$_1$ to BL$_3$ and the source line SL are canceled out, and the voltage of the semiconductor body 7 is not affected consequently. The page erase operation in which the voltage V$_{FB}$"0" in the "0" erase state of the semiconductor body 7 is assumed to be a second data retention voltage (which is an example of "second data retention voltage" in the claims) is performed to assign logical storage data "0".

Now, a mechanism of the page erase operation will be described with reference to FIGS. 4DA to 4DD. FIGS. 4DA to 4DD are different from FIGS. 4BA to 4BD in that the bit lines BL$_1$ to BL$_3$ are kept at Vss or put in a floating state and the word line WL$_2$ is kept at Vss during the page erase operation. Accordingly, from time T1 to time T2, even when the source line SL rises from Vss to V$_{sLH}$, the second N-channel MOS transistor region of the word line WL$_2$ is non-conducting, and the memory cell current does not flow therethrough. Therefore, the group of positive holes 9 caused by an impact ionization phenomenon are not generated. The others are the same as in FIGS. 4BA to 4BD, and the source line SL changes between Vss and V$_{SLH}$ and the plate line PL$_2$ changes between V$_{PLL}$ and V$_{PLH}$. As a result, as illustrated in FIG. 4DC, the group of positive holes 9 are discharged to the first impurity region, namely, the N$^+$ layer 3a, of the source line SL.

Now, a mechanism of the page erase operation will be described with reference to FIGS. 4EA to FIG. 4ED. FIGS. 4EA to 4ED are different from FIGS. 4BA to 4BD in that the source line SL is kept at Vss or put in a floating state and the plate line PL$_2$ is kept at Vss during the page erase operation. Accordingly, from time T1 to time T2, even when the bit lines $BL_1$ to $BL_3$ rise from Vss to $V_{BLH}$, the first N-channel MOS transistor region of the plate line $PL_2$ is non-conducting, and the memory cell current does not flow therethrough. Therefore, the group of positive holes 9 caused by an impact ionization phenomenon are not generated. The others are the same as in FIGS. 4BA to 4BD, and the bit lines $BL_1$ to $BL_3$ change between Vss and $V_{BLH}$ and the word line $WL_2$ changes between Vss and $V_{WLH}$. As a result, as illustrated in FIG. 4EC, the group of positive holes 9 are discharged to the second impurity region, namely, the $N^+$ layer 3b, of the bit lines $BL_1$ to $BL_3$.

Figure 5A:
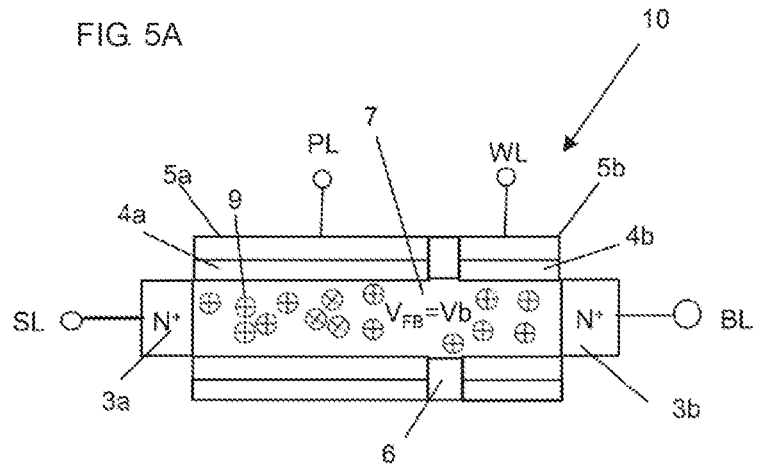
FIGS. 5A to 5C are diagrams for explaining a mechanism of a read operation of the SGT-including memory device according to the first embodiment.
Figure 5B:
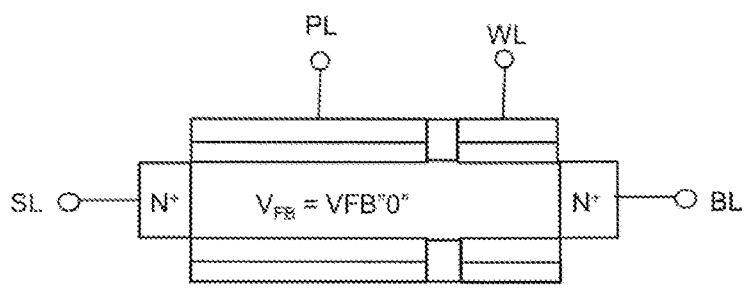
Figure 5C:
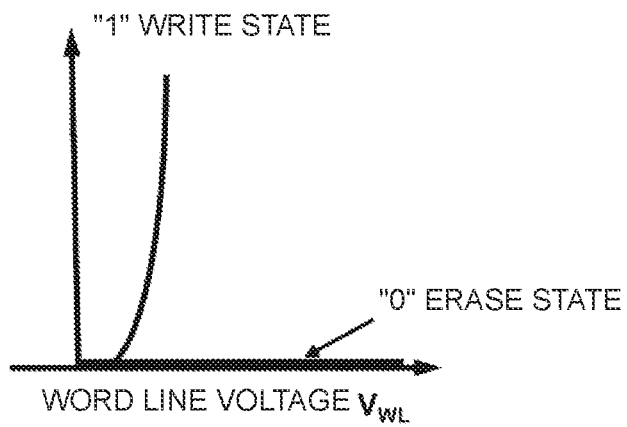

FIGS. 5A to 5C are diagrams for explaining a read operation for the dynamic flash memory cell according to the first embodiment of the present invention. As illustrated in FIG. 5A, when the semiconductor body 7 is charged up to the built-in voltage Vb (about 0.7 V), the threshold voltage of the second N-channel MOS transistor region having the second gate conductor layer 5b to which the word line WL is connected decreases due to a substrate bias effect. This state is assigned to logical storage data "1". As illustrated in FIG. 5B, a memory block selected before writing is in an erase state "0" in advance, and the voltage $V_{FB}$ of the semiconductor body 7 is equal to $V_{FB}$"0". With the write operation, a write state "1" is stored at random. As a result, logical storage data of logical "0" and that of logical "1" are created for the word line WL. As illustrated in FIG. 5C, the level difference between the two threshold voltages of the word line WL is used to perform reading by a sense amplifier. When the voltage applied to the first gate conductor layer 5a connected to the plate line PL is set to a voltage higher than the threshold voltage at the time of logical storage data "1" and lower than the threshold voltage at the time of logical storage data "0" in reading of logical "0" data, a property that a current does not flow even when the voltage of the word line WL is increased can be attained.

Now, a multi-page erase operation (which is an example of "multi-page erase operation" in the claims) will be described with reference to FIG. 6A to FIGS. 6DA and 6DB.

Figure 6A:
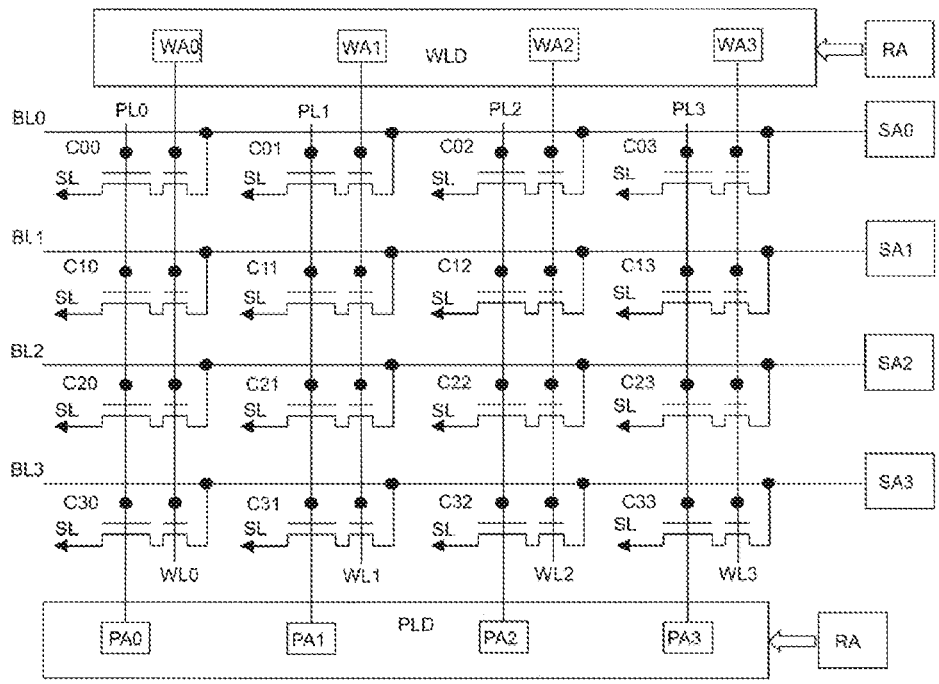
FIG. 6A is a diagram for explaining a mechanism of a multi-page erase operation of the SGT-including memory device according to the first embodiment.

FIG. 6A illustrates a part of a block in which memory cells C00 to C33 are disposed in four rows and four columns. In the actual memory block, the number of memory cells is larger than that in four rows and four columns. To each of the memory cells, a corresponding one of the word lines WL0 to WL3, a corresponding one of the plate lines PL0 to PL3, and a corresponding one of the bit lines BL0 to BL3 are connected. The bit lines BL0 to BL3 are respectively connected to sense amplifier circuits SA0 to SA3. The word lines WL0 to WL3 are connected to a word line decoder circuit WLD (which is an example of "word line decoder circuit" in the claims), and the plate lines PL0 to PL3 are connected to a plate line decoder circuit PLD (which is an example of "driving control line decoder circuit" in the claims). To the word line decoder circuit WLD and the plate line decoder circuit PLD, a row address RA (which is an example of "row address" in the claims) is input, and selection from among the word lines WL0 to WL3 and selection from among the plate lines PL0 to PL3 are made. Word line address latch circuits WA0 to WA3 (which are examples of "word line address latch circuit" in the claims) for respectively storing the addresses of the word lines WL0 to WL3 upon selection are provided in the word line decoder circuit WLD, and plate line address latch circuits PA0 to PA3 (which are examples of "driving control line address latch circuit" in the claims) for respectively storing the addresses of the plate lines PL0 to PL3 upon selection are provided in the plate line decoder circuit PLD.

Now, the multi-page erase operation will be specifically described with reference to FIG. 6A. A case where, for example, a plurality of sets of row addresses RA are sequentially input at random to the word line decoder circuit WLD and the plate line decoder circuit PLD is assumed. When the first row address RA is for selection of WL0 and PL0, the row address RA is stored (latched) in the word line address latch circuit WA0 and the plate line address latch circuit PA0. When the next row address RA is for selection of WL3 and PL3, the row address RA is stored (latched) in the word line address latch circuit WA3 and the plate line address latch circuit PA3. Next, the multi-page erase operation is performed in which the word lines WL0 and WL3 and the plate lines PL0 and PL3 are simultaneously selected, and pieces of storage data in the memory cells C00, C10, C20, C30, C03, C13, C23, and C33 are simultaneously erased. The mechanism of the operation and the operation waveforms conform to those illustrated in FIGS. 4BA to 4BD.

Figure 6B:
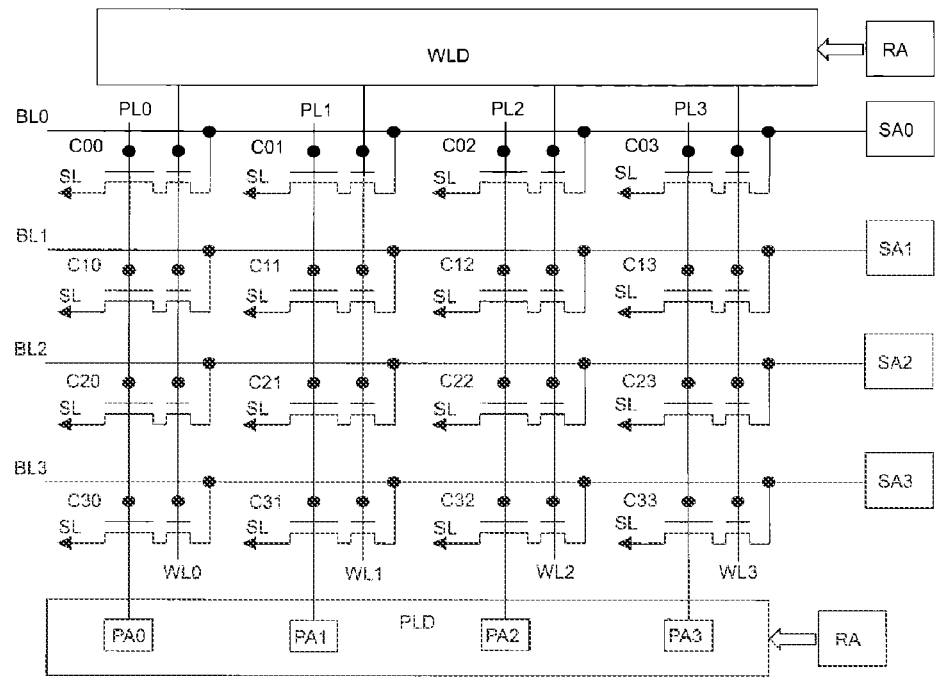
FIG. 6B is a diagram for explaining the mechanism of the multi-page erase operation of the SGT-including memory device according to the first embodiment.

FIG. 6B illustrates an example where the plate line address latch circuits PA0 to PA3 are provided in the plate line decoder circuit PLD and the multi-page erase operation is performed on the basis of latch data of plate line addresses stored in the plate line address latch circuits PA0 to PA3. Here, the mechanism of the operation and the operation waveforms conform to those illustrated in FIGS. 4DA to 4DD.

Figure 6C:
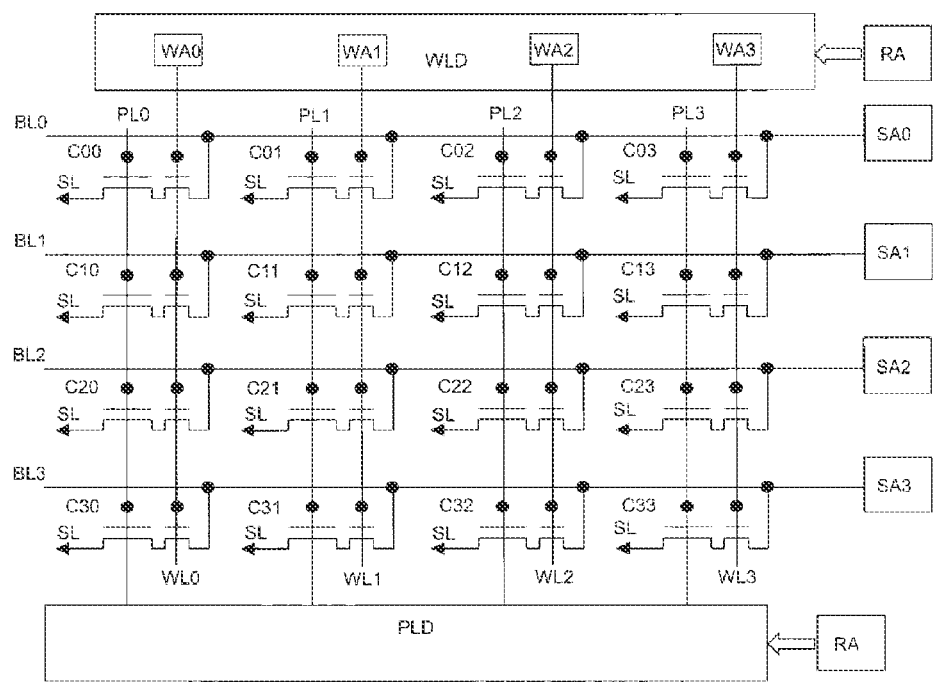
FIG. 6C is a diagram for explaining the mechanism of the multi-page erase operation of the SGT-including memory device according to the first embodiment.

FIG. 6C illustrates an example where the word line address latch circuits WA0 to WA3 are provided in the word line decoder circuit WLD and the multi-page erase operation is performed on the basis of latch data of word line addresses stored in the word line address latch circuits WA0 to WA3. Here, the mechanism of the operation and the operation waveforms conform to those illustrated in FIGS. 4EA to 4ED.

Figure 6D:
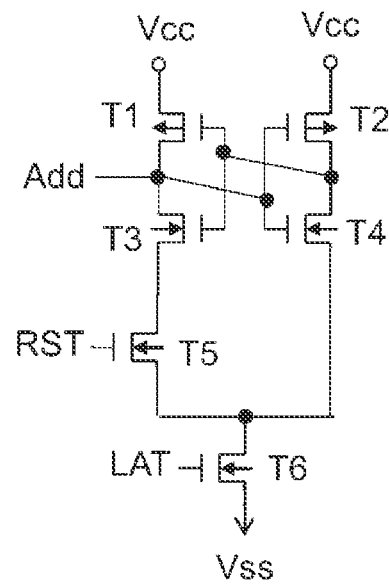
FIGS. 6DA and 6DB are diagrams for explaining the mechanism of the multi-page erase operation of the SGT-including memory device according to the first embodiment.
Figure 6D:
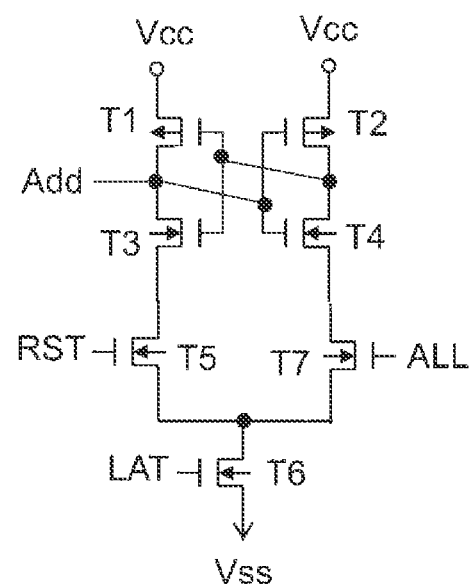
Figure 7A:
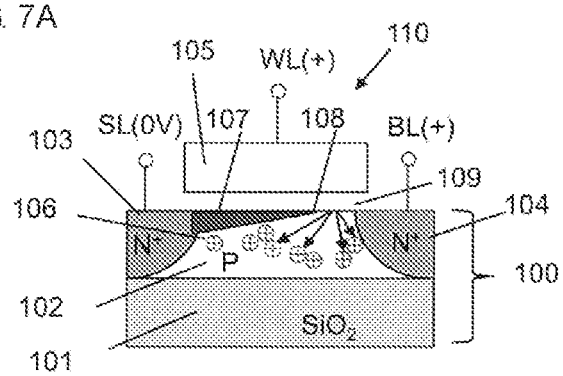
FIGS. 7A to 7D are diagrams for explaining a write operation of a DRAM memory cell including no capacitor in the related art.
Figure 7B:
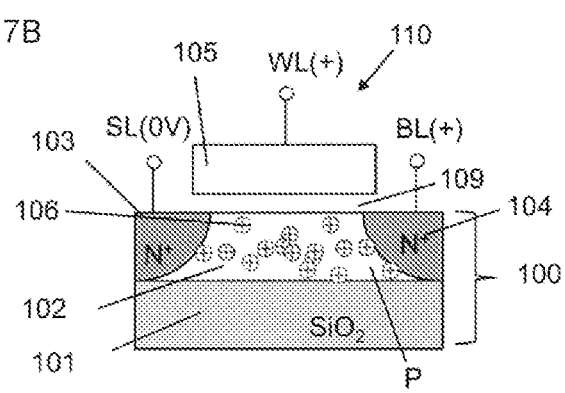
Figure 7C:
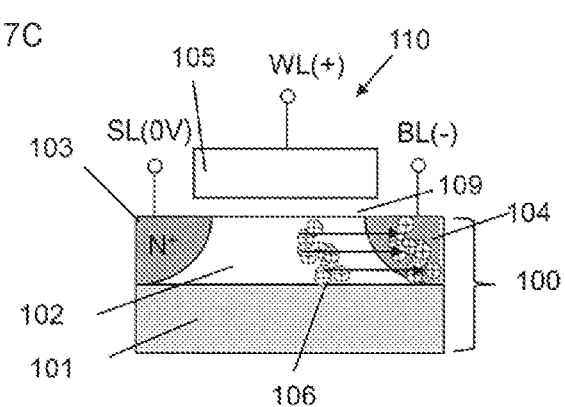
Figure 7D:
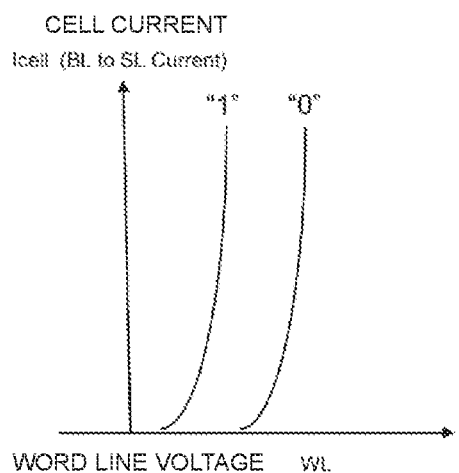
Figure 8A:
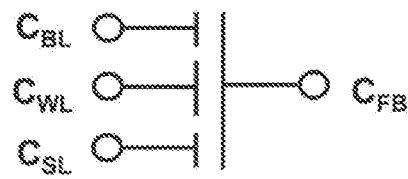
FIGS. 8A and 8B are diagrams for explaining a problem in the operation of the DRAM memory cell including no capacitor in the related art.
Figure 8B:
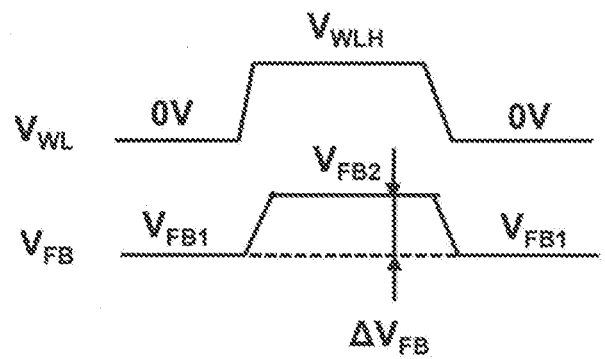
Figure 9A:
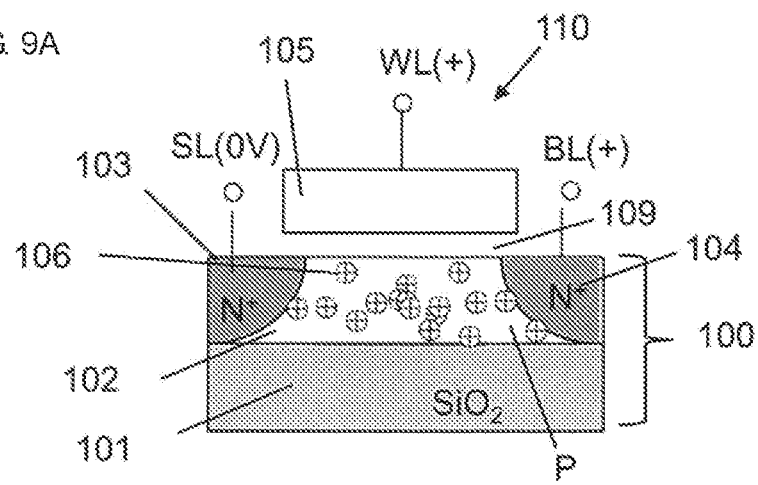
FIGS. 9A to 9C are diagrams for explaining a read operation of the DRAM memory cell including no capacitor in the related art.
Figure 9B:
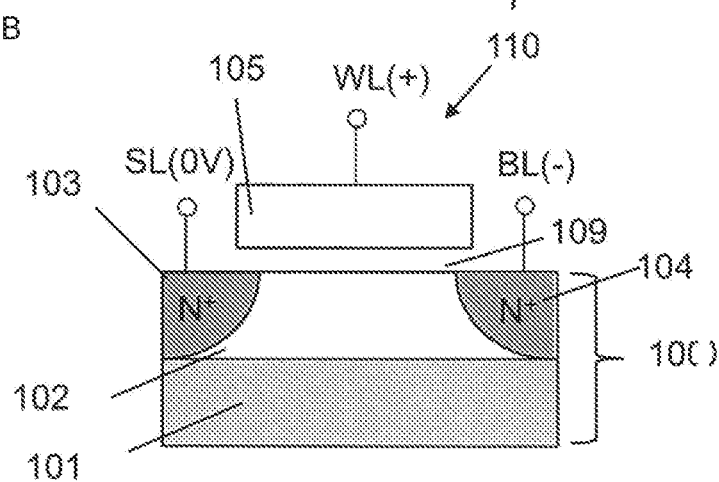
Figure 9C:
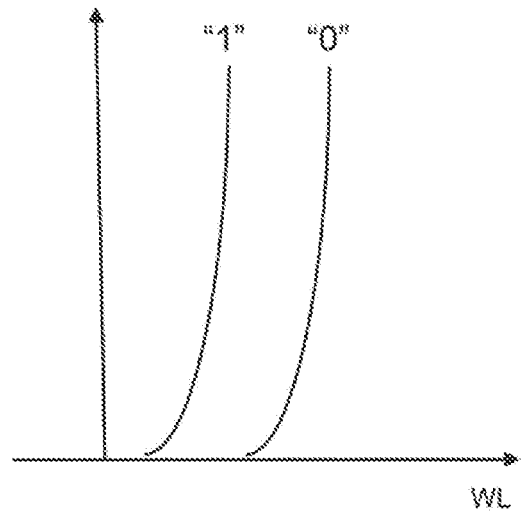

FIG. 6DA is a specific circuit diagram for the word line address latch circuits WA0 to WA3 and the plate line address latch circuits PA0 to PA3. In FIGS. 6DA and 6DB, T1 and T2 are P-channel MOS transistors, and T3 to T6 are N-channel MOS transistors. A word line address or plate line address Add is stored in a latch circuit (flip-flop circuit) constituted by the MOS transistors T1 to T4. Before a row address RA is input to the word line decoder circuit WLD and the plate line decoder circuit PLD, a reset signal RST and a latch signal LAT rise to a high voltage, and address data in the latch circuit is reset. When a word line address or plate line address Add is selected, the latch signal LAT rises to a high voltage this time, and the word line address or plate line address Add is stored in the latch circuit (flip-flop circuit) constituted by the MOS transistors T1 to T4.

As illustrated in FIG. 6DB, an N-channel MOS transistor T7 can be added, all row addresses RA can be selected with the word line address latch circuits WA0 to WA3, the plate line address latch circuits PA0 to PA3, or both of the word line address latch circuits WA0 to WA3 and the plate line address latch circuits PA0 to PA3, and all of the pieces of page data in the block can be erased. In this case, when an all-word-line selection signal ALL (which is an example of "all-word-line selection signal" in the claims) or an all-driving-control-line selection signal ALL (which is an example of "all-driving-control-line selection signal" in the claims) is input to the gate of the N-channel MOS transistor T7, all word line addresses, all plate line addresses, or all word line addresses and all plate line addresses are selected.

Regardless of whether the horizontal cross-sectional shape of the Si column 2 illustrated in FIG. 1 is a round shape, an elliptic shape, or a rectangular shape, the operations of the dynamic flash memory described in this embodiment can be performed. Further, a dynamic flash memory cell having a round shape, a dynamic flash memory cell having an elliptic shape, and a dynamic flash memory cell having a rectangular shape may coexist on the same chip.

With reference to FIG. 1, the dynamic flash memory element including, for example, an SGT in which the first gate insulator layer 4a and the second gate insulator layer 4b that surround the entire side surface of the Si column 2 standing on the substrate 1 in the vertical direction are provided and which includes the first gate conductor layer 5a and the second gate conductor layer 5b that entirely surround the first gate insulator layer 4a and the second gate insulator layer 4b has been described. As described in this embodiment, the dynamic flash memory element needs to have a structure that satisfies the condition that the group of positive holes 9 generated by an impact ionization phenomenon are retained in the semiconductor body 7. For this, the semiconductor body 7 needs to have a floating body structure isolated from the substrate 1. Accordingly, even when the semiconductor body is formed horizontally along the substrate 1 by using, for example, GAA (Gate All Around, see, for example, J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, May 2006) technology, which is one type of SGT, or nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017), the above-described operations of the dynamic flash memory can be performed. Alternatively, the dynamic flash memory element may have a device structure using SOI (Silicon On Insulator) (see, for example, J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain Leakage (GIDL) Current for Low-Power and High-Speed Embedded Memory", IEEE IEDM (2006)). In this device structure, the bottom portion of the semiconductor body is in contact with an insulating layer of the SOI substrate, and the other portion of the semiconductor body is surrounded by a gate insulator layer and an element isolation insulating layer. With such a structure, the semiconductor body also has a floating body structure. Accordingly, the dynamic flash memory element provided in this embodiment needs to satisfy the condition that the semiconductor body has a floating body structure. Even with a structure in which a Fin transistor (see, for example, H. Jiang, N. Xu, B. Chen, L. Zeng1, Y. He, G. Du, X. Liu and X. Zhang: "Experimental investigation of self-heating effect (SHE) in multiple-fin SOI FinFETs", Semicond. Sci. Technol. 29 (2014) 115021 (7pp)) is formed on an SOI substrate, as long as the semiconductor body has a floating body structure, the operations of the dynamic flash memory can be performed.

To write "1", electron-positive hole pairs may be generated by using a gate-induced drain leakage (GIDL) current (see, for example, E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-69, April 2006), and the semiconductor body 7 may be filled with the generated group of positive holes.

Expressions (1) to (12) provided in the specification and in the drawings are expressions used to qualitatively explain the phenomena, and are not intended to limit the phenomena.

Although the reset voltages of the word line WL, the bit line BL, and the source line SL are specified as Vss in the descriptions of FIGS. 3AA to 3AC and FIG. 3B, the reset voltages of the respective lines may be set to different voltages.

Although FIGS. 4BA to 4BD to FIGS. 4EA to 4ED illustrate example conditions of the page erase operation, the voltages applied to the source line SL, the plate line PL, the bit line BL, and the word line WL may be changed as long as a state in which the group of positive holes 9 in the semiconductor body 7 are discharged through one or both of the $N^+$ layer 3a and the $N^+$ layer 3b can be attained. Further, in the page erase operation, a voltage may be applied to the source line SL of a selected page, and the bit line BL may be put in a floating state. In the page erase operation, a voltage may be applied to the bit line BL of a selected page, and the source line SL may be put in a floating state.

In FIG. 1, in the vertical direction, in a part of the semiconductor body 7 surrounded by the insulating layer 6 that is the first insulating layer, the potential distribution of the first semiconductor body 7a and that of the second semiconductor body 7b are connected and formed. Accordingly, the first semiconductor body 7a and the second semiconductor body 7b that constitute the semiconductor body 7 are connected in the vertical direction in the region surrounded by the insulating layer 6 that is the first insulating layer.

Note that in FIG. 1, it is desirable to make the length of the first gate conductor layer 5a, in the vertical direction, to which the plate line PL is connected further longer than the length of the second gate conductor layer 5b, in the vertical direction, to which the word line WL is connected to attain $C_{PL} > C_{WL}$. However, when the plate line PL is only added, the capacitive coupling ratio ($C_{WL}/(C_{PL}+C_{WL}+C_{BL}+C_{SL})$) of the word line WL to the semiconductor body 7 decreases. As a result, the potential change $\Delta V_{FB}$ of the semiconductor body 7 that is a floating body decreases.

As the voltage $V_{PLL}$ of the plate line PL, a fixed voltage of, for example, 2 V may be applied in operation modes other than a mode in which selective erasing is performed in a block erase operation.

Note that in the specification and the claims, the meaning of "cover" in a case of "a gate insulator layer, a gate conductor layer, or the like covers a channel or the like" also includes a case of surrounding entirely as in an SGT or GAA, a case of surrounding except a portion as in a Fin transistor, and a case of overlapping a flat object as in a planar transistor.

In FIG. 1, the first gate conductor layer 5a may be divided into two or more gate conductor layers in plan view or in the vertical direction, and the gate conductor layers may each function as a conductive electrode of the plate line and may be operated synchronously or asynchronously at identical driving voltages or different driving voltages. Similarly, the second gate conductor layer 5b may be divided into two or more gate conductor layers in plan view or in the vertical direction, and the gate conductor layers may each function as a conductive electrode of the word line and may be operated synchronously or asynchronously at identical driving voltages or different driving voltages. In this case, the operations of the dynamic flash memory can also be performed. In a case where the first gate conductor layer 5a is divided into two or more gate conductor layers, at least one of the first gate conductor layers obtained as a result of division assumes the roles of the first gate conductor layer 5a described above. In a case where the second gate conductor layer 5b is divided into two or more gate conductor layers, at least one of the second gate conductor layers obtained as a result of division assumes the roles of the second gate conductor layer 5b described above. In the vertical direction, isolated gate conductor layers obtained from one of the first gate conductor layer 5a or the second gate conductor layer 5b may be disposed on the respective sides of the other of the first gate conductor layer 5a or the second gate conductor layer 5b.

The above-described conditions of voltages applied to the bit line BL, the source line SL, the word line WL, and the plate line PL and the voltage of the floating body are examples for performing basic operations including the erase operation, the write operation, and the read operation, and other voltage conditions may be employed as long as the basic operations of the present invention can be performed.

In FIG. 1, the first gate conductor layer 5a may be connected to the word line WL and the second gate conductor layer 5b may be connected to the plate line PL. In this case, the above-described operations of the dynamic flash memory can also be performed.

Further, a junction-less structure in which the conductivities of the N$^+$ layers 3a and 3b and the P-layer semiconductor body 7 of the dynamic flash memory cell illustrated in FIG. 1 are made identical may be employed. The same applies to other embodiments.

This embodiment has the following features.

Feature 1

The dynamic flash memory cell of this embodiment is constituted by the N$^+$ layers 3a and 3b that function as the source and the drain, the semiconductor body 7, the first gate insulator layer 4a, the second gate insulator layer 4b, the first gate conductor layer 5a, and the second gate conductor layer 5b, which are formed in a columnar form as a whole. The N$^+$ layer 3a that functions as the source is connected to the source line SL, the N$^+$ layer 3b that functions as the drain is connected to the bit line BL, the first gate conductor layer 5a is connected to the plate line PL, and the second gate conductor layer 5b is connected to the word line WL. A structure is employed in which the gate capacitance of the first gate conductor layer 5a to which the plate line PL is connected is larger than the gate capacitance of the second gate conductor layer 5b to which the word line WL is connected, which is a feature. In the dynamic flash memory cell, the first gate conductor layer and the second gate conductor layer are stacked in the vertical direction. Accordingly, even when the structure is employed in which the gate capacitance of the first gate conductor layer 5a to which the plate line PL is connected is larger than the gate capacitance of the second gate conductor layer 5b to which the word line WL is connected, the memory cell area does not increase in plan view. Accordingly, a high-performance and highly integrated dynamic flash memory cell can be implemented.

Feature 2

In the page erase operation for the dynamic flash memory cell according to the first embodiment of the present invention, both or one of the first gate conductor layer 5a to which the plate line PL is connected and the second gate conductor layer 5b to which the word line WL is connected transition from a low-voltage state to a high-voltage state, both or one of the PN junction between the source N$^+$ layer 3a and the semiconductor body 7 and the PN junction between the drain N$^+$ layer 3b and the semiconductor body 7 are put in a forward bias state with capacitive coupling with the semiconductor body 7, and the group of positive holes 9 in the semiconductor body 7 are discharged to the source N$^+$ layer 3a and the drain N$^+$ layer 3b.

Feature 3

After the operation for the dynamic flash memory cell according to the first embodiment of the present invention described in Feature 2, both or one of the first gate conductor layer 5a to which the plate line PL is connected and the second gate conductor layer 5b to which the word line WL is connected return from the high-voltage state to the low-voltage state, and the voltage of the semiconductor body 7 is changed to a negative bias with capacitive coupling with the semiconductor body 7 again. As described above, the voltage of the semiconductor body 7 in the "0" erase state can be changed to a negative bias without application of a negative bias to the source N$^+$ layer 3a or the drain N$^+$ layer 3b. Accordingly, a twin well structure or a negative bias generation circuit for applying a negative bias is not necessary, and this facilitates the design and processes of the memory core and peripheral circuits.

Feature 4

In terms of the roles of the first gate conductor layer 5a to which the plate line PL is connected in the dynamic flash memory cell according to the first embodiment of the present invention, in the write operation and in the read operation performed by the dynamic flash memory cell, the voltage of the word line WL changes. At this time, the plate line PL assumes the role of decreasing the capacitive coupling ratio between the word line WL and the semiconductor body 7. As a result, an effect on changes in the voltage of the semiconductor body 7 when the voltage of the word line WL changes can be substantially suppressed. Accordingly, the difference between the threshold voltages of the SGT transistor of the word line WL indicating logical "0" and logical "1" can be increased. This leads to an increased operation margin of the dynamic flash memory cell. When the voltage applied to the first gate conductor layer 5a connected to the plate line PL is set to a voltage higher than the threshold voltage at the time of logical storage data "1" and lower than the threshold voltage at the time of logical storage data "0" in reading of logical "0" data, a property that a current does not flow even when the voltage of the word line WL is increased can be attained. This leads to a further increased operation margin of the dynamic flash memory cell.

Feature 5

In the dynamic flash memory cell according to the first embodiment, the multi-page erase operation described with reference to FIG. 6A to FIGS. 6DA and 6DB can be performed. Therefore, storage data in each of the memory cells in a plurality of pages can be rewritten fast. Accordingly, the dynamic flash memory can be incorporated not only in stand-alone memory devices but also in logic circuits of CPUs, GPUs, MPUs, and the like as a main memory device, and this leads to wide application to high-speed systems.

Feature 6

Although FIG. 6C illustrates an example where the plate line decoder circuit does not include the plate line address latch circuits, a plate line can be provided in common to the memory cells C00 to C33, and the plate line decoder circuit can also be eliminated. Accordingly, not only the processes and the circuit are simplified, but also a higher speed can be attained.

Feature 7

For the dynamic flash memory cells in the first embodiment, although the page erase operation described with reference to FIG. 4A to FIGS. 4EA to 4ED is performed, rewriting is performed with a low electric field far lower than that in a flash memory. Therefore, in terms of reliability, the limit of the number of rewrites in the page erase operation need not be specified.

OTHER EMBODIMENTS

Although the Si column is formed in the present invention, a semiconductor column made of a semiconductor material other than Si may be formed. The same applies to other embodiments according to the present invention.

In a vertical NAND-type flash memory circuit, memory cells that are stacked in a plurality of tiers in the vertical direction and each of which is constituted by a semiconductor column, which functions as the channel, and a tunnel oxide layer, a charge storage layer, an interlayer insulating layer, and a control conductor layer that surround the semiconductor column are formed. At the semiconductor columns on both ends of these memory cells, a source line impurity region corresponding to the source and a bit line impurity region corresponding to the drain are disposed respectively. In addition, for one memory cell, when one of the memory cells on both sides of the one memory cell functions as the source, the other functions as the drain. Accordingly, the vertical NAND-type flash memory circuit is one type of SGT circuit. Therefore, the present invention is also applicable to a circuit in which a NAND-type flash memory circuit coexists.

To write "1", electron-positive hole pairs may be generated by an impact ionization phenomenon using a gate-induced drain leakage (GIDL) current described in E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-69, April 2006, and the floating body FB may be filled with the generated group of positive holes. The same applies to other embodiments according to the present invention.

Even with a structure in which the polarity of the conductivity type of each of the $N^+$ layers 3a and 3b and the P-layer Si column 2 in FIG. 1 is reversed, the operations of the dynamic flash memory can be performed. In this case, in the Si column 2 that is of N-type, the majority carriers are electrons. Therefore, a group of electrons generated by impact ionization are stored in the semiconductor body 7, and a "1" state is set.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

With the semiconductor-element-including memory device according to the present invention, a high-density and high-performance dynamic flash memory that is an SGT-including memory device can be obtained.

What is claimed is:

1. A semiconductor element memory device comprising a plurality of pages disposed in lines, each of the pages being constituted by a plurality of memory cells arranged in columns on a substrate, each of the memory cells included in each of the pages comprising:

a semiconductor body that stands on the substrate in a vertical direction relative to the substrate or that extends along the substrate in a horizontal direction relative to the substrate;

a first impurity region and a second impurity region that are disposed at respective ends of the semiconductor body;

a gate insulator layer that is in contact with a side surface of the semiconductor body between the first impurity region and the second impurity region;

a first gate conductor layer that partially or entirely covers the gate insulator layer; and a second gate conductor layer that is adjacent to the first gate conductor layer and that is in contact with a side surface of the gate insulator layer, wherein in each of the memory cells, voltages applied to the first gate conductor layer, the second gate conductor layer, the first impurity region, and the second impurity region are controlled to retain a group of positive holes, generated by an impact ionization phenomenon or a gate-induced drain leakage current, inside the semiconductor body, in a page write operation, a voltage of the semiconductor body is made equal to a first data retention voltage that is higher than the voltage of one of the first impurity region or the second impurity region or the voltages of both of the first impurity region and the second impurity region, in each of the memory cells that constitute a page among the pages, the voltage of the semiconductor body is controlled so as to be higher than the first data retention voltage with one or both of first capacitive coupling between the first gate conductor layer and the semiconductor body and second capacitive coupling between the second gate conductor layer and the semiconductor body, and the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region, in a page erase operation, the voltage of the semiconductor body is made equal to a second data retention voltage lower than the first data retention voltage with the first capacitive coupling and the second capacitive coupling, and in the page erase operation, at least two or more pages are simultaneously selected from among the pages and a multi-page erase operation is performed.

2. The semiconductor element memory device according to claim 1, wherein
in the page erase operation,
the voltage of the first gate conductor layer is increased from a first voltage to a second voltage higher than the first voltage, or the voltage of the second gate conductor layer is increased from a third voltage to a fourth voltage higher than the third voltage,
in a first period, the voltage of the semiconductor body is controlled so as to be higher than the first data retention voltage with the first capacitive coupling and the second capacitive coupling,
in a second period, the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by a built-in voltage, and
in a third period, the voltage of the semiconductor body is made equal to the second data retention voltage lower than the first data retention voltage with the first capacitive coupling and the second capacitive coupling.

3. The semiconductor element memory device according to claim 1, wherein
in a page, among the pages, in which a plurality of the semiconductor bodies are arranged in columns, in the page erase operation, the page erase operation is performed for all of the semiconductor bodies in the page simultaneously.

4. The semiconductor element memory device according to claim 2, wherein
with application of the voltages to the first impurity region and the second impurity region and with one or both of the first capacitive coupling and the second capacitive coupling, an inversion layer is not formed in the semiconductor body in the first period, a part of the second period, and the third period in which the voltage of the semiconductor body is changed.

5. The semiconductor element memory device according to claim 1, wherein
a first gate capacitance between the first gate conductor layer and the semiconductor body is made larger than a second gate capacitance between the second gate conductor layer and the semiconductor body.

6. The semiconductor element memory device according to claim 1, wherein
the group of positive holes are discharged from inside the semiconductor body through one of the first impurity region or the second impurity region, and the other of the first impurity region or the second impurity region is put in a floating state.

7. A semiconductor element memory device comprising a block in which the plurality of pages in the semiconductor element memory device according to claim 1 are disposed, wherein
the first impurity region of each of the memory cells included in each of the plurality of pages is connected to a source line, the second impurity region thereof is connected to a corresponding one of bit lines, one of the first gate conductor layer or the second gate conductor layer thereof is connected to a corresponding one of word lines, and the other of the first gate conductor layer or the second gate conductor layer is connected to a corresponding one of driving control lines,
the source line is connected to the semiconductor bodies in the block, and
voltages are applied to the source line, the bit lines, the driving control lines, and the word lines to perform the page erase operation of discharging the group of positive holes in all of the semiconductor bodies in a page selected from among the pages in the block.

8. The semiconductor element memory device according to claim 7, wherein
a row address is decoded by a word line decoder circuit to select a word line from among the word lines, the word line decoder circuit includes a word line address latch circuit, and at least two or more word lines are selected in the multi-page erase operation.

9. The semiconductor element memory device according to claim 7, wherein
a row address is decoded by a driving control line decoder circuit to select a driving control line from among the driving control lines, the driving control line decoder circuit includes a driving control line address latch circuit, and at least two or more driving control lines are selected in the multi-page erase operation.

10. The semiconductor element memory device according to claim 8, wherein
to the word line address latch circuit, an all-word-line selection signal is input, and all of the word lines in the block are selected in the multi-page erase operation.

11. The semiconductor element memory device according to claim 9, wherein
to the driving control line address latch circuit, an all-driving-control-line selection signal is input, and all of the driving control lines in the block are selected in the multi-page erase operation.

12. The semiconductor element memory device according to claim 1, wherein
one or both of the first gate conductor layer and the second gate conductor layer is divided into two or more isolated gate conductor layers in plan view or in the vertical direction, and the isolated gate conductor layers are operated synchronously or asynchronously.

13. The semiconductor element memory device according to claim 12, wherein
in the vertical direction, the isolated gate conductor layers obtained from one of the first gate conductor layer or the second gate conductor layer are disposed on respective sides of the other of the first gate conductor layer or the second gate conductor layer.

* * * * *